(12) United States Patent
Baliarda et al.

(10) Patent No.: US 8,196,829 B2
(45) Date of Patent: Jun. 12, 2012

(54) CHIP MODULE, SIM CARD, WIRELESS DEVICE AND WIRELESS COMMUNICATION METHOD

(75) Inventors: Carles Puente Baliarda, Barcelona (ES); Jordi Soler Castany, Girona (ES)

(73) Assignee: Fractus, S.A., Barcelona (ES)

( * ) Notice: Subject to any disclaimer, the term of this patent is extended or adjusted under 35 U.S.C. 154(b) by 491 days.

(21) Appl. No.: 12/308,417

(22) PCT Filed: Jun. 22, 2007

(86) PCT No.: PCT/EP2007/005547
§ 371 (c)(1),
(2), (4) Date: Jan. 16, 2009

(87) PCT Pub. No.: WO2007/147629
PCT Pub. Date: Dec. 27, 2007

(65) Prior Publication Data
US 2010/0019038 A1    Jan. 28, 2010

Related U.S. Application Data

(60) Provisional application No. 60/816,811, filed on Jun. 27, 2006.

(30) Foreign Application Priority Data

Jun. 23, 2006    (EP) .................................... 06115954

(51) Int. Cl.
*G06K 7/00*    (2006.01)
(52) U.S. Cl. ........................................ 235/439; 235/492
(58) Field of Classification Search .................. 235/492, 235/439
See application file for complete search history.

(56) References Cited

U.S. PATENT DOCUMENTS 5,569,879 A    10/1996    Gloton et al.
(Continued)

FOREIGN PATENT DOCUMENTS
DE    19500925    7/1996
(Continued)

OTHER PUBLICATIONS

Zhao, J.; Raman, S., Design of "Chip-Scale" patch antennas for 5-6GHz wireless microsystems, Antennas and propagation society international symposium, Jul. 2001.

(Continued)

*Primary Examiner* — Allyson Trail
(74) *Attorney, Agent, or Firm* — Winstead PC

(57) ABSTRACT

The invention refers to a chip module comprising at least one memory and/or microprocessor chip and at least one antenna element connected to said chip. Further the invention relates to a SIM card comprising a dielectric substrate, eight or more contact pads provided on one side of said dielectric substrate, at least one memory and/or microprocessor chip provided on the other side of the substrate and connected to said contact pads, a first antenna element provided on the same side of the dielectric substrate as the chip, wherein the first antenna element has at least one driving point and at least one termination point, a second antenna element provided on the same side of the dielectric substrate as the first antenna element, wherein the first antenna element is given in an area different from the area where the contact pads are arranged, and the chip can be accessed by a wireless communication link with help of the antenna operating at a frequency of more than 800 MHz.

40 Claims, 18 Drawing Sheets

U.S. PATENT DOCUMENTS

Figure 1:
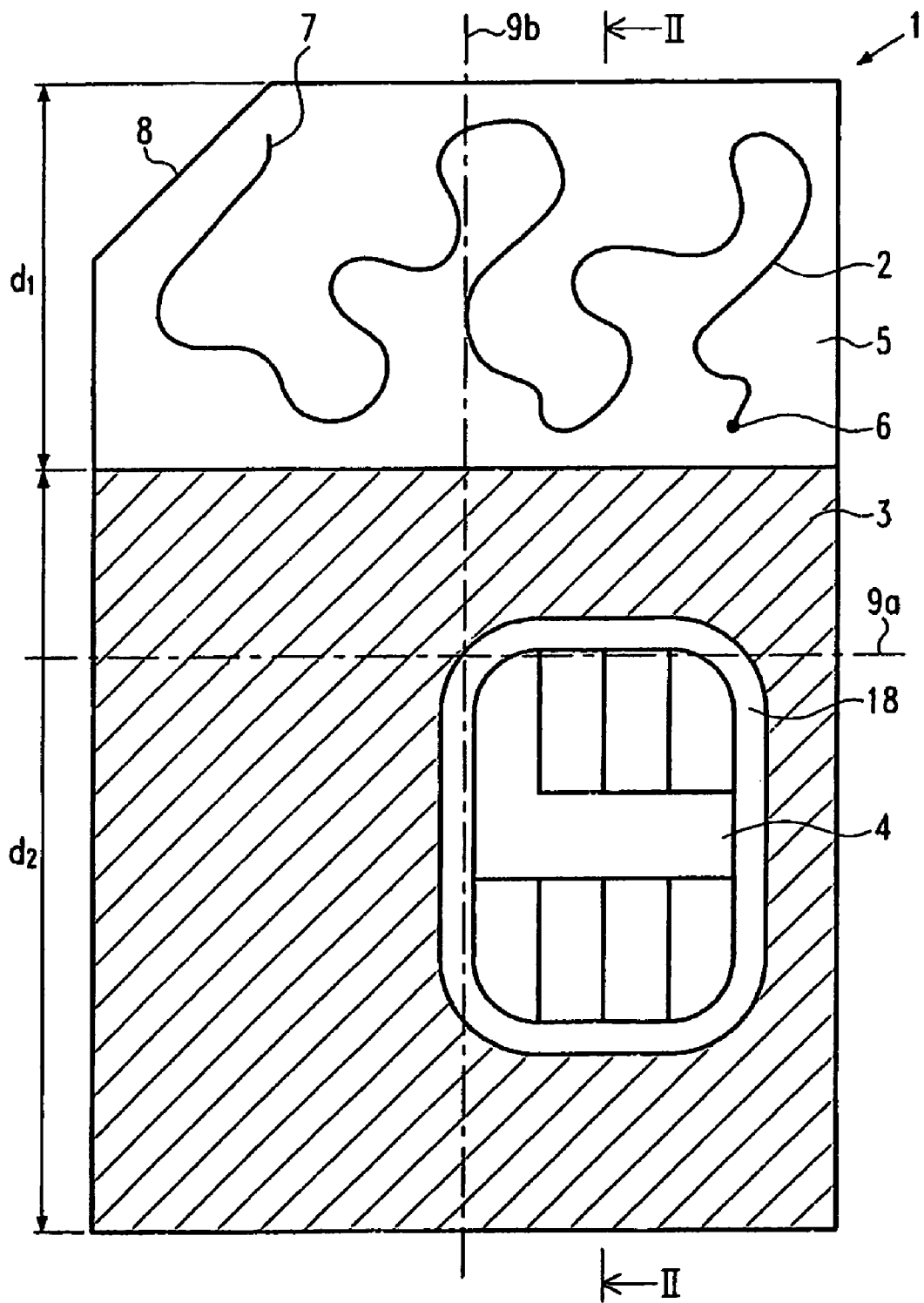

| | | | |
|---|---|---|---|
| 5,710,458 A | 1/1998 | Iwasaki | |
| 5,987,741 A * | 11/1999 | Banakis et al. | 29/842 |
| 6,236,366 B1 | 5/2001 | Yamamoto et al. | |
| 6,239,752 B1 | 5/2001 | Blanchard | |
| 6,240,301 B1 | 5/2001 | Phillips | |
| 6,263,193 B1 | 7/2001 | Iseki et al. | |
| 6,268,796 B1 | 7/2001 | Gnadinger et al. | |
| 6,285,342 B1 | 9/2001 | Brady et al. | |
| 6,320,543 B1 | 11/2001 | Ohata et al. | |
| 6,373,447 B1 | 4/2002 | Rostoker et al. | |
| 6,421,013 B1 | 7/2002 | Chung | |
| 6,424,315 B1 | 7/2002 | Glenn et al. | |
| 6,465,880 B1 | 10/2002 | Dobashi et al. | |
| 6,535,175 B2 | 3/2003 | Brady et al. | |
| 6,630,910 B2 | 10/2003 | Forster et al. | |
| 6,670,921 B2 | 12/2003 | Sievenpiper et al. | |
| 6,710,744 B2 | 3/2004 | Morris et al. | |
| 6,745,945 B1 | 6/2004 | Limelette et al. | |
| 6,998,709 B2 | 2/2006 | Khorram | |
| 7,015,868 B2 | 3/2006 | Puente Baliarde et al. | |
| 7,072,698 B2 | 7/2006 | Underbrink et al. | |
| 7,145,511 B2 | 12/2006 | Tang et al. | |
| 7,148,850 B2 | 12/2006 | Puente Baliarda et al. | |
| 7,586,414 B2 | 9/2009 | Kai et al. | |
| 2001/0046126 A1 | 11/2001 | Colello | |
| 2001/0054755 A1 | 12/2001 | Kirkham | |
| 2002/0033773 A1* | 3/2002 | Hirabayashi | 343/702 |
| 2002/0149527 A1 | 10/2002 | Wen et al. | |
| 2003/0102544 A1 | 6/2003 | Nishikawa | |
| 2004/0014428 A1 | 1/2004 | Franca-Neto | |
| 2004/0129785 A1 | 7/2004 | Luu | |
| 2004/0129786 A1 | 7/2004 | Reignoux et al. | |
| 2005/0238149 A1* | 10/2005 | De Leon | 379/93.12 |
| 2006/0141958 A1 | 6/2006 | Brosnan | |
| 2009/0113231 A1* | 4/2009 | Sakamoto et al. | 713/501 |

FOREIGN PATENT DOCUMENTS

| | | |
|---|---|---|
| EP | 0822512 | 2/1998 |
| EP | 0902472 | 3/1999 |
| EP | 0978729 | 2/2000 |
| EP | 1085597 | 3/2001 |
| EP | 1126522 | 8/2001 |
| FR | 2800245 | 5/2001 |
| FR | 2848025 | 6/2004 |
| JP | 01311605 | 12/1989 |
| JP | 06152509 | 5/1994 |
| JP | 2002141726 | 5/2002 |
| JP | 2004104344 | 4/2004 |
| WO | 0034916 | 6/2000 |
| WO | 0077728 | 12/2000 |
| WO | 0104957 | 1/2001 |
| WO | 0154225 | 7/2001 |
| WO | 0178192 | 10/2001 |
| WO | 0201495 | 1/2002 |
| WO | 02060004 | 8/2002 |
| WO | 03050913 | 6/2003 |
| WO | 2004019261 | 3/2004 |
| WO | 2004021271 | 3/2004 |
| WO | 2004042868 | 5/2004 |
| WO | 2004093243 | 10/2004 |
| WO | 2005076409 | 8/2005 |
| WO | 2005109330 | 11/2005 |
| WO | 2006008180 | 1/2006 |
| WO | 2006034940 | 4/2006 |
| WO | 2006106187 | 10/2006 |
| WO | 2007045725 | 4/2007 |

OTHER PUBLICATIONS

Davis, M.F. et al, RF-microwave multi-layer integrated passives using fully organic system on package (SOP) technology, IEEE MTT-S International microwave symposium digest, May 20, 2001.

Abrial, A. et al, A new contactless smart card IC using an on-chip antenna and an asynchronous microcontroller, IEEE Journal of solid-state circuits, Jul. 2001.

Zhang, Y. et al, Cofired laminated ceramic package antenna for single-chip wireless transceivers, Microwave and optical technology letters, Apr. 2002.

Pham, N., Minimized dual-band coupled line meander antenna for system-in-a-package applications, IEEE Antennas and Propagation Society International Symposium, Jun. 20, 2004.

Contacless technology for secure physical acces: technology and standars choices, Smart Card Alliance, Oct. 2002.

Soler, J., FracWave antenna technology for full wireless system in package (FWSiP), Fractus, Sep. 2005.

BGB101A TrueBlue Bluetooth module, Koninklijke Philips Electronics N.V., Jun. 3, 2002.

BGB201 TrueBlue Bluetooth module, Koninklijke Philips Electronics N.V., Oct. 2002.

Hall, P. S., System applications—the challenge for active integrated antennas, AP2000 Millenium conference on antennas and propagation, Apr. 2000.

Solutions for wireless communications, ST Microelectronics, 2001.

Radio-frequency identification, Wikipedia, Apr. 22, 2008.

Oswal, P. et al, RFID vs Contactless smart cards—An unending debate, Industrial Technologies Frost & Sullivan Asia Pacific, Oct. 4, 2006.

Jaggard, D. L. Rebuttal expert report of Dr. Dwight L. Jaggard (redacted version). Fractus, 20110216.

Long, S. A. Rebuttal expert report of Dr. Stuart A. Long (redacted version). Fractus, 20110216.

Jaggard, D. L. Expert report of Dwight L. Jaggard (redacted)—expert witness retained by Fractus. Fractus, 20110223.

Dakeya, Y. Chip multilayer antenna for 2.45Hz-Band application using LTCC Technology. IEEE MTTs, 20000101.

* cited by examiner

CHIP MODULE, SIM CARD, WIRELESS DEVICE AND WIRELESS COMMUNICATION METHOD

This patent application is a national stage filing of PCT/EP2007/005547, which was filed on Jun. 22, 2007. International Patent Application No. PCT/EP2007/005547 claims priority from U.S. Provisional Patent Application No. 60/816,811, which was filed on Jun. 27, 2006. International Patent Application No. PCT/EP2007/005547 and U.S. Provisional Patent Application No. 60/816,811 are incorporated herein by reference.

The present invention relates to a chip module. Such a chip module may comprise a memory and/or a microprocessor chip.

A particular chip module is known from WO 2004/021271 A1. This chip module may be connected to an antenna which is provided in a device into which the module may be inserted.

The object of the present invention is to provide an improved chip module and an improved wireless device with the chip module, a SIM (subscriber identification module) card, a wireless device with a SIM card and a wireless communication method.

This problem is solved by the appended independent claims. Preferred embodiments are disclosed in the dependent claims.

The chip module of the present invention may e.g., comprise an antenna element, which preferably is connected to said chip.

The first antenna element is preferably connected to an RF-terminal of the chip.

This connection may be done e.g. by a wire bond, a coplanar transmission line, a slot line or a strip line.

With such an antenna element, it would be possible to connect to the memory or microprocessor in the chip module by a wireless communication system without the need of electrically contacting the chip in order to process or obtain data from the memory and/or microprocessor chip.

Nevertheless, the chip module may comprise contact means by which the chip may be connected directly through direct electric contact. Those contact means preferably comprise pads which are accessible from the outside of the chip module.

In a preferred embodiment, those contact means comprise at least 2, 4, 6, 8, 10, 12, 15 or more pads.

The antenna is preferably located in an area where there are no contact means or contact pads. Such contact pads are generally electrically conductive and may, therefore, absorb or alter the radiation of the antenna element. If the chip module is essentially rectangular (with or without a notch) the antenna element will be in the half of the chip module where there is not the major portion of the contact pads when considering the rectangular shape divided in two equal portions by a line extending parallel to the short edge of the rectangle.

Preferably, in a view perpendicular to the chip module plane, the contact means or contact pads do not overlap the antenna element. The same preferably applies to a second antenna element which will be discussed below.

The antenna element in a preferred embodiment has a conductive pattern. This pattern is provided in 1, 2, 3 or more planes, while multiple of those planes are preferably parallel to each other.

The at least one antenna element preferably has a driving point (feeding point) and at least or exactly 1, 2, 3 or more termination points. In some embodiments, the at least one antenna element includes 1, 2, 3 or more connections to a radio frequency (RF) ground. In case of more than one termination point, the antenna element will be a multiple branch antenna. Except for the feeding point in some embodiments, the first antenna element may be separated from the second antenna element (see below) by a minimum distance of at least 1, 2, 3, 4, 5, 6, 7, 8, 9, or 10 mm and/or not more than 1.5, 2, 3, 4, 5, 6, 7, 8, 9, 10, 11 mm. Preferred is a distance between 1 and 3 mm.

Further the driving point preferably is separated from the chip module edge by at least 1, 2, 3, 4, 5, 6, 7, 8, 9, or 10 mm and/or not more than 1.5, 2, 3, 4, 5, 6, 7, 8, 9, 10, 11 mm.

The driving point is preferably located not further away from a feeding terminal of the chip than 1, 2, 3, 4, 5, 7, 10, 12, 15, 20, 25, 30, 40, 50 percent of largest extension of the chip module.

If the chip module is essentially rectangular (with or without a notch) the driving point may be provided in the half where there is the major portion of the contact pads when considering the rectangular shape divided in two equal portions by a line extending parallel to the long edge of the rectangle.

Any termination point may be open ended, which means that this end is not electrically connected to any other item. Any termination end may also be connected to the chip or to a second antenna element (see below).

If the chip module is essentially rectangular (with or without notch) the chip module has four areas separated by two straight lines crossing in the middle of the rectangle one being parallel to the short edge and the other being parallel to the long edge of the rectangle. One of those four areas contains the major portion of the contact pad area. A termination point or two or three or more or all termination points may be provided in the area which is the diagonally opposite area to that of the contact pads.

The chip module preferably comprises a dielectric substrate. It may, however, comprise 2, 3 or more dielectric substrates and/or a multilayer substrate in order to provide different layers in which conductive elements may be provided.

The antenna element may be provided entirely on one and the same plane. Further, the antenna element may be provided in the same plane or on the same surface of a dielectric substrate as the contact means or the contact pads. The antenna element may, however, also be provided on a different plane or surface or different planes or surfaces.

The first and/or second antenna element may be provided on the same surface of a dielectric substrate as the chip(s) or on different surfaces.

The chip module is preferably compliant with the ISO 7816 standard.

In particular, the chip module is preferably a SIM card, such as e.g. for a wireless phone or handheld wireless device or a multifunctional wireless device.

As mentioned above, the chip module may comprise 1, 2, 3 or more chips. One chip may be e.g., a memory. Further, the chip module may comprise a microprocessor and/or it may comprise a radio frequency chip which is suitable for generating and/or receiving radio frequency signals which can then be fed to the antenna element or antenna elements.

The chip module may additionally comprise a second antenna element (as mentioned above). The second antenna element may be a ground plane or a ground counterpoise. It may also be a second antenna element of the dipole antenna such as a second antenna arm, where the other (first) arm is given by the first antenna element.

The second antenna element is preferably connected to the chip, in particular, to an RF terminal of the chip and/or a ground terminal.

In a view onto the chip module in which the chip module appears with the largest size, the second antenna element may cover a certain percentage of the chip module size such as e.g., more than 10, 20, 30, 40, 50, 60, 70, 80, 85 or 90 percent or it may cover less than 20, 30, 40, 50, 60, 70, 80, 85, 90 or 95 percent. In a plane where there are no other conductive elements it may also cover 100% of the size. In this case the first antenna element will be provided below or above this second antenna element.

The second antenna element has 1, 2, 3 or more clearances. A clearance in the second antenna element is an area in the plane of the second antenna element where there is no portion of the second antenna element. Such a clearance may be used for e.g., locating the first antenna element or for locating contact means/pads. Further, the clearance may be used to locate a chip that extends in or into the plane of the second antenna element.

The clearance which accommodates the first antenna element will preferably be provided next to a notch of the chip module.

The area covered by the clearance in which the first antenna element is provided may be more or less than a percentage of 10, 20, 30, 40, 50, 60, 70, 80, or 90 percent of the area covered by the second antenna element. Typically the area of the clearance may be between 40 and 70 percent of the area of the second antenna element.

The clearance in which the contact pads are provided can be made such that it surrounds and encloses the contact pads (in a view perpendicular onto the chip module).

The first antenna element and/or the second antenna element may comprise at least 4, 5, 6, 7, 8, 9, 10, 12, 15, 17, 20, 25 or 30 segments. A segment may be straight or curved.

It is preferred that right and left curved segments are provided (when following the curve) and/or that at connection points of a straight segment angles to the left and to the right (when following the curve) are provided. Preferably the number of left and right curved segments (if provided) does not differ by more than 80, 70, 60, 50, 40, 30, 20 or 10% of the larger of the two numbers. Also the number of connection angles between adjacent segments which following the curve go to the right and those that go to the left do not differ by more than 80, 70, 60, 50, 40, 30, 20 or 10% of the larger of the two numbers. Further preferably the number of the left curved segments plus the number of the connections points where the curve turns left and the number of the right curved segments plus the number of connection points where the curve turns right do not differ by more than 80, 70, 60, 50, 40, 30, 20 or 10% of the larger of the two numbers. With those measures it is possible to reduce the inductance of the curve, which would be given when e.g. coiling a curve by all angles or almost all (all but one, two or three) angles and/or curved segments turning to the same direction.

Furthermore, the first and/or second antenna element may be shaped according to a space filling curve, a box counting curve, a grid dimension curve or a multilevel structure as defined below.

The first and second antenna element may be provided in the same plane or on the same surface of a dielectric substrate or on different planes or surfaces.

The chip module preferably has an essentially rectangular outer shape with a notch in one corner in order to identify the orientation of the chip module and hence the location of contact pads, if present. It may e.g. have a length of 25 mm and/or a width of 10 mm.

The first antenna element has a termination point which is preferably closer to a chip module border than to the second antenna element. The termination point is preferably close to or at a chip module border which does not limit the first antenna element.

The first antenna element may further be a slot.

The first antenna element may be a monopole. As mentioned above, the first antenna element may also be a dipole or part of a dipole.

The second antenna element may be connected to a contact pad that is used for grounding purposes. A ground plane may, however, not be connected to any contact pad. The latter is in particular advantageous in case of a dipole, loop or folded dipole antenna, where the ground plane may be floating.

Furthermore, between the chip and the first and/or second antenna element, a passive network or an active network may be provided. The network may be a matching network, a filter or a balun network:

The chip module may be adapted for wireless operation in a range of up to 3 to 5 m.

Further the chip module is adapted for operation in the far field, which in practical purposes means, that data transmission via the wireless connection is carried out between devices which are separated by more than a half-wavelength.

Typical operation frequencies are above 800 MHz such as 868 MHz, 915 MHz or 2.4 GHz or any other ISM (Industry, Science, Medicine) band.

The chip module preferably has a (largest) thickness of less than 1.5, 1.2, 1.0, 0.9, 0.8, 0.7, 0.6 or 0.5 mm and/or a thickness of more than 0.6, 0.7, 0.8, 0.9, 1.0, 1.2, or 1.5 mm. Particularly preferred is a value of 0.8±0.05 mm.

A wireless device comprises a chip module as explained above or further below.

The wireless device may e.g. be a cellular phone or another multifunctional wireless device such as e.g. a PDA.

In such a wireless device, the first and/or second antenna element is preferably separated from the ground of the wireless device and/or from the battery of the wireless device by more than 0.5, 0.7, 1.0, 1.2 or 1.5 mm and/or less than 5, 4, 3, 2 or 1 mm.

The ground of the chip module is preferably connected to the ground of the wireless device. This connection may be ohmic or capacitive or inductive. Preferred is a direct ohmic contact.

The wireless device may comprise a battery. Such a battery may have a ground contact with which it will be connected to the ground of the wireless device. Further the wireless device may comprise a display (e.g. LCD), a digital connector, a power supply connector and/or an antenna of a mobile telephone system. The chip module is preferably separated from the ground contact of the battery and/or the ground contact of the display and/or the ground contact of the digital connector or power supply connector and/or a grounded element or ground contact of the mobile telephone system antenna and/or a mobile telephone system antenna itself and/or a Bluetooth/WIFI antenna by at least 20, 30, 40, 50, 60, 70 or 80 percent of the largest extension of the wireless device.

The wireless device may have a chip module holder. This chip module holder preferably is made of or comprises plastic or dielectric materials. It is preferred that no metallic or conductive materials are provided in the holder.

The chip module is preferably arranged in such an orientation that the first antenna element shows to the periphery while the second antenna element shows towards the interior of the wireless device, when the chip module is substantially parallel to the ground plane of the wireless device.

The chip module may be contacted by another device, which reads out information from the chip of the chip module. With this information the device may perform actions which are only possible with the data of the chip module, without, however, this device actually having the chip module incorporated. The performed actions may be financial transactions or telephone calls, or the like. In this way e.g. a wireless phone system of a car may contact the chip module and thereby perform a telephone call with the identification data of the chip module. Equally a computer may access the identification data and perform internet actions, financial transactions or the like. Another possibility is for instance to execute a remote payment transaction with a mobile phone or handheld device without necessarily connecting to a mobile or cellular network, but directly to a payment unit placed at a short distance (typically below 30, 20 or 10 m) of the mobile phone, handheld device or multifunctional wireless device.

The chip module preferably is removable from the wireless device. The wireless device is constructed such that the chip module is exchangeable (without destroying the wireless device).

Figure 2:
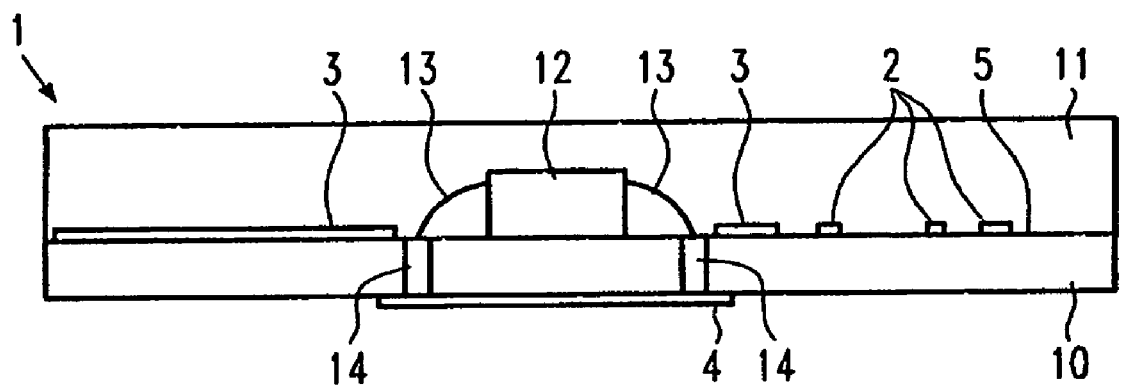
Figure 3:
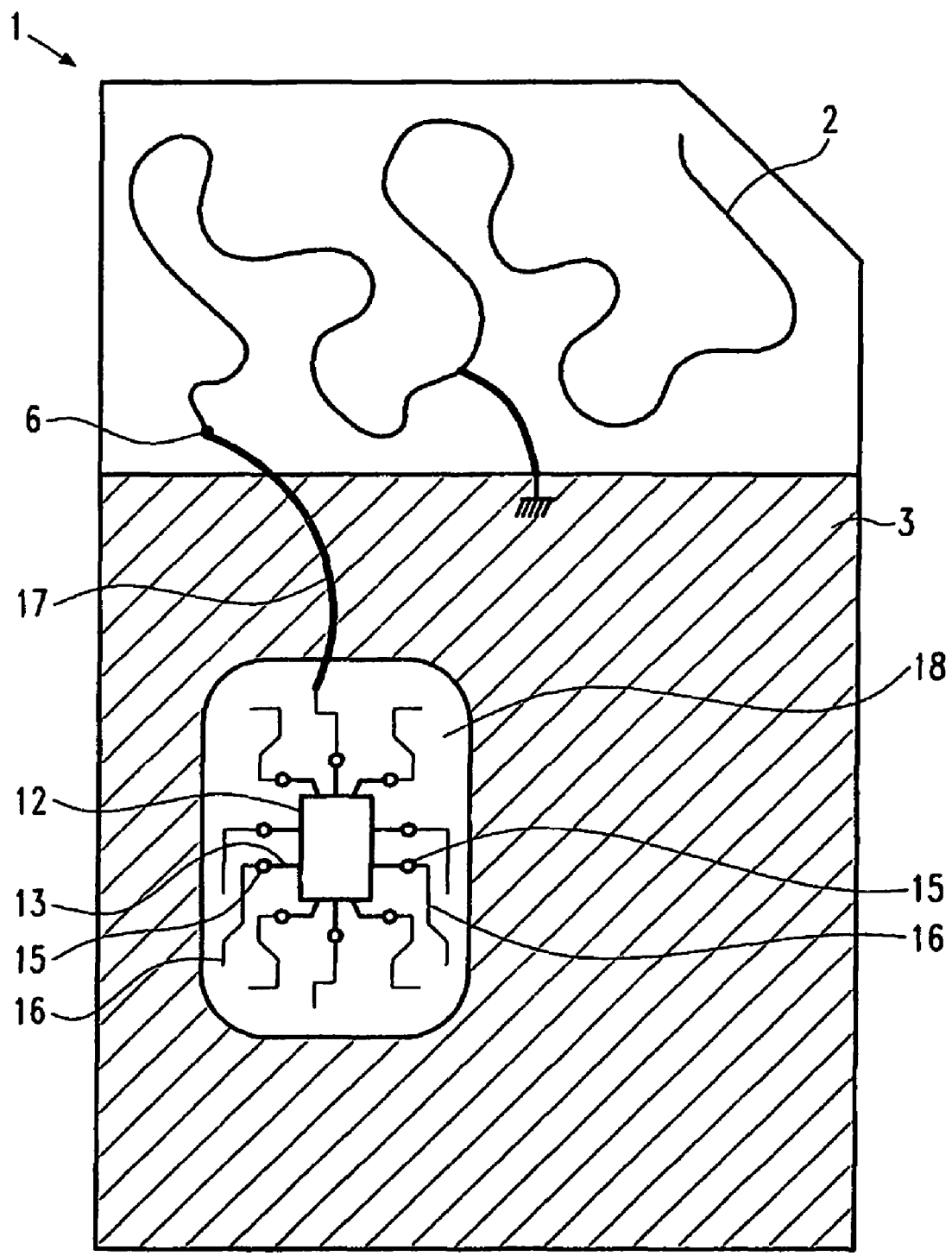
Figure 4A:
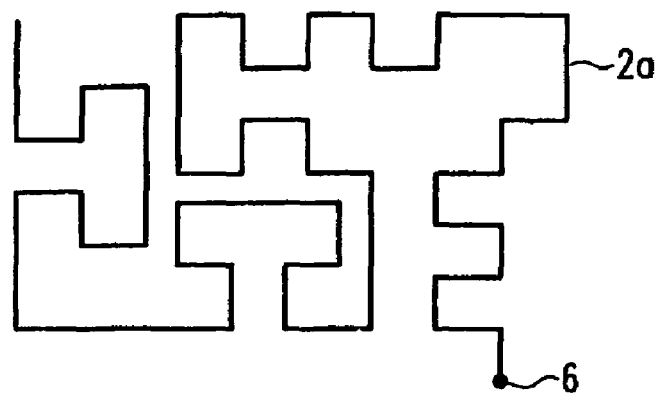
Figure 4B:
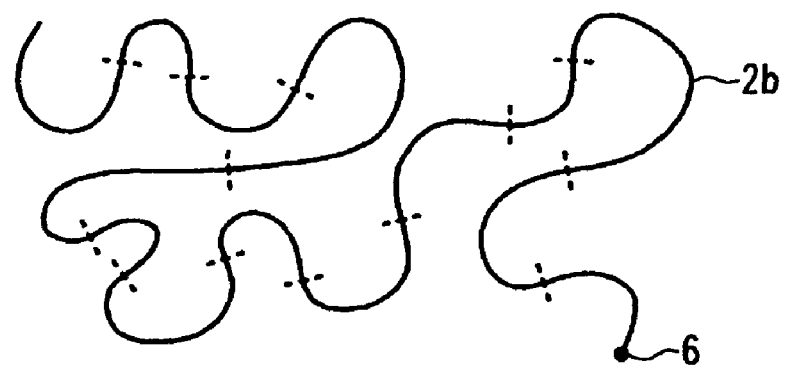
Figure 4C:
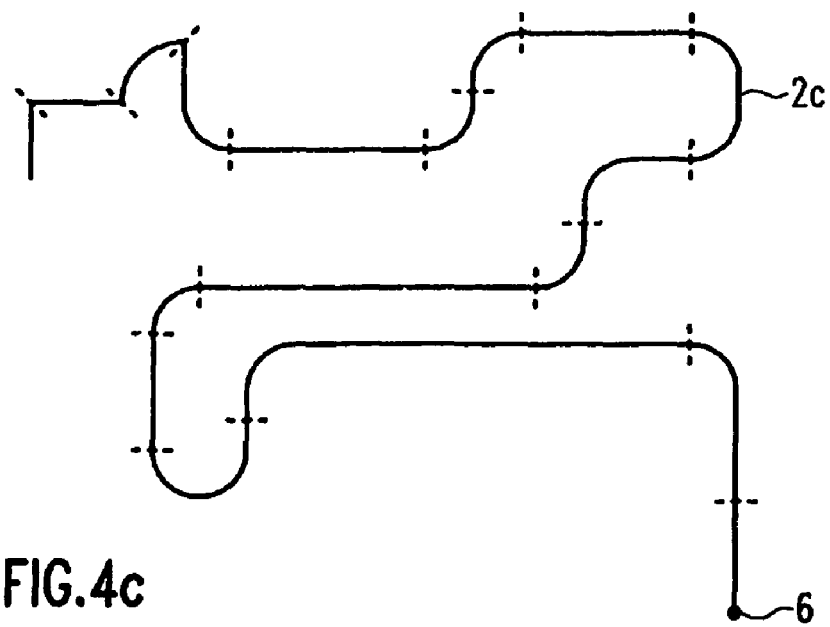
Figure 5:
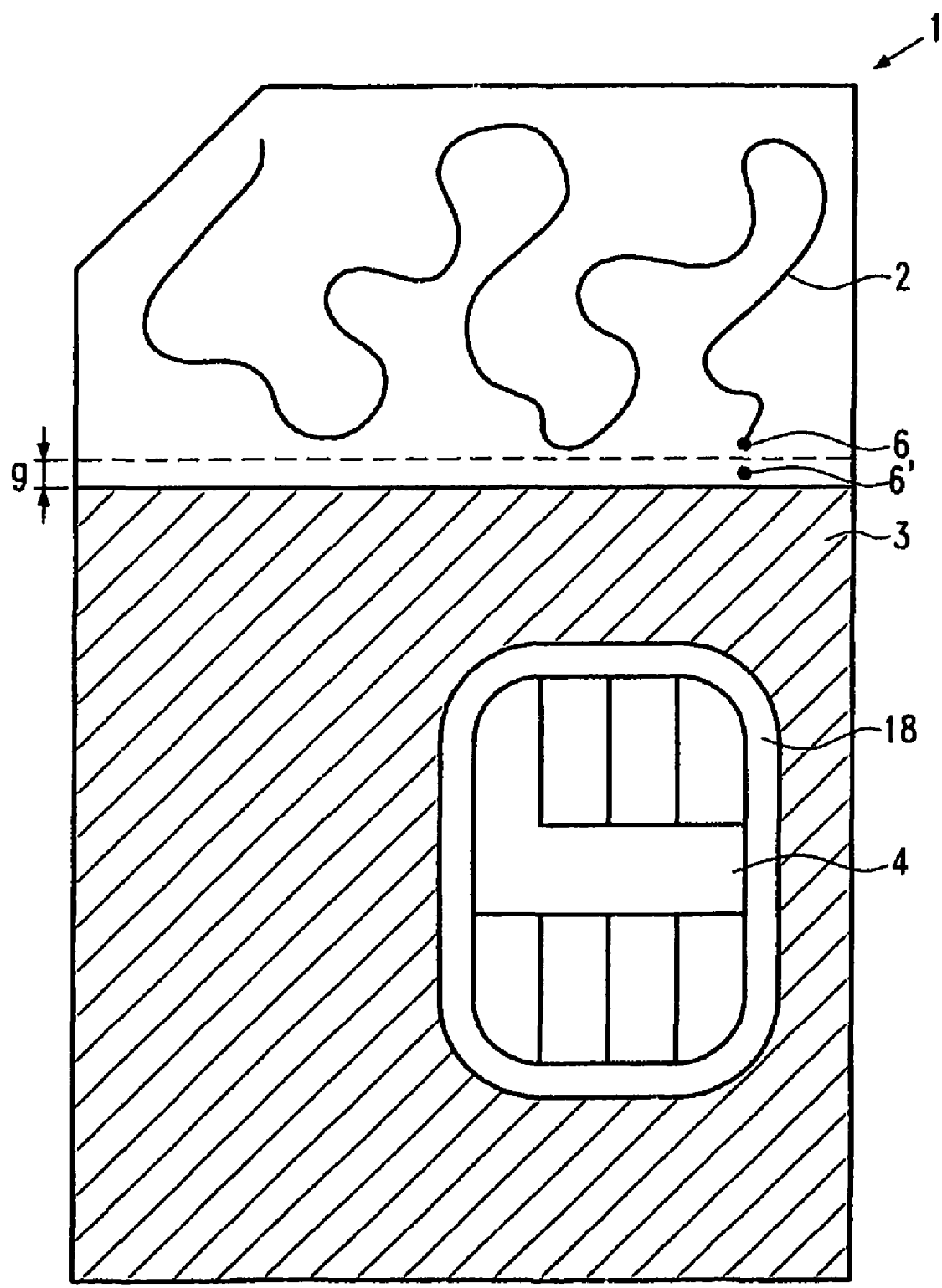
Figure 6:
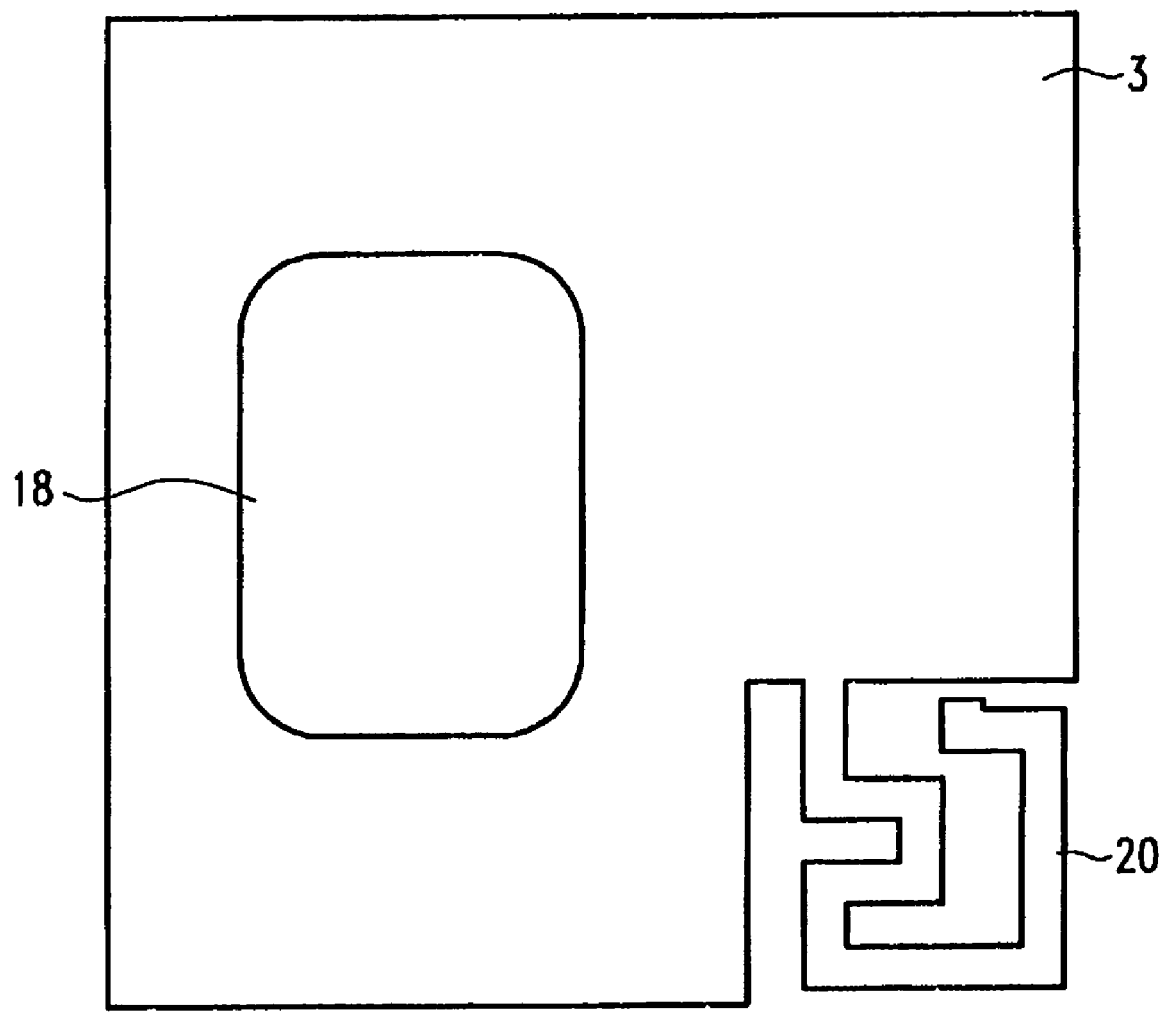
Figure 7:
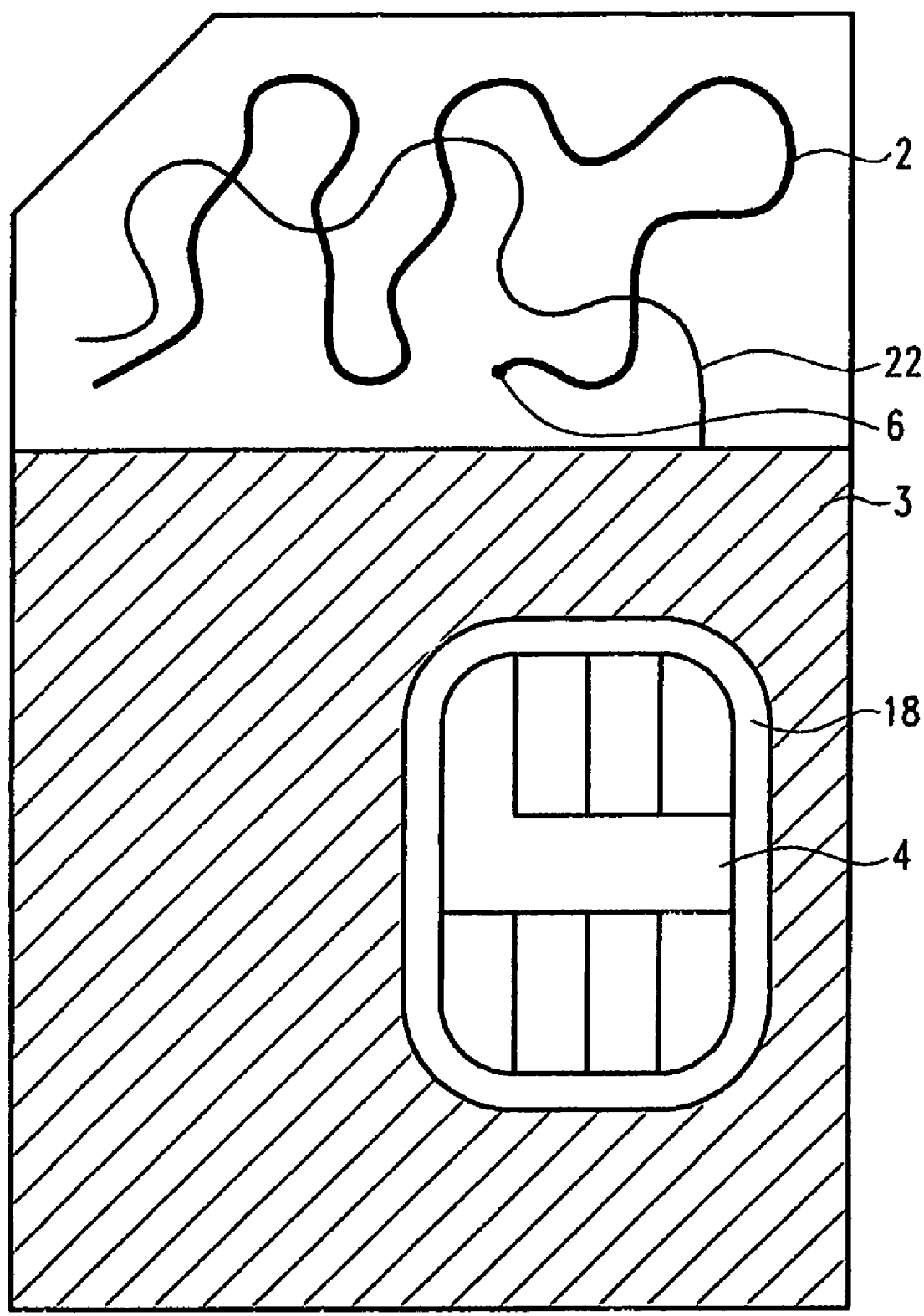
Figure 8:
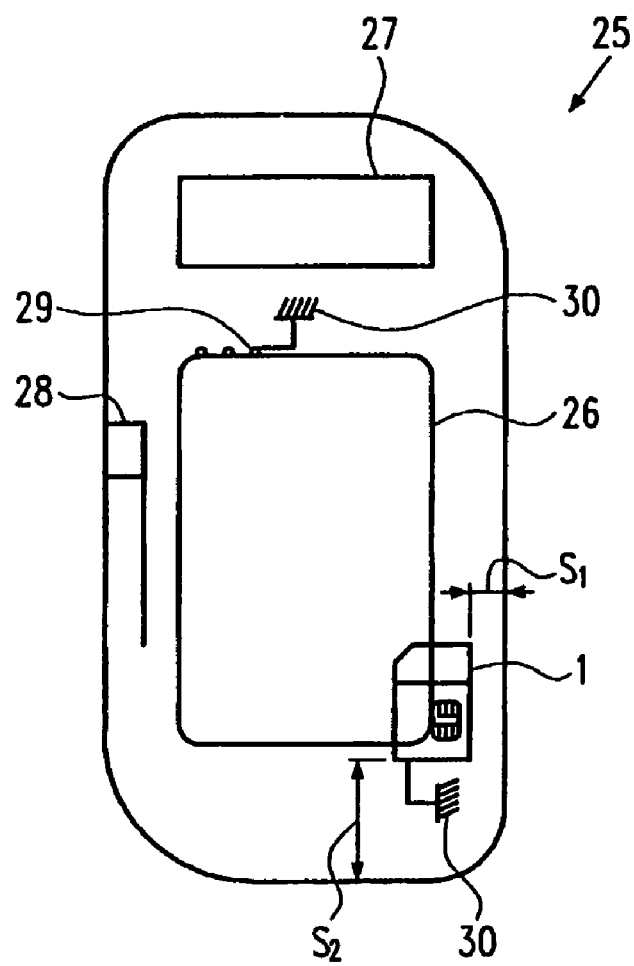
Figure 9:
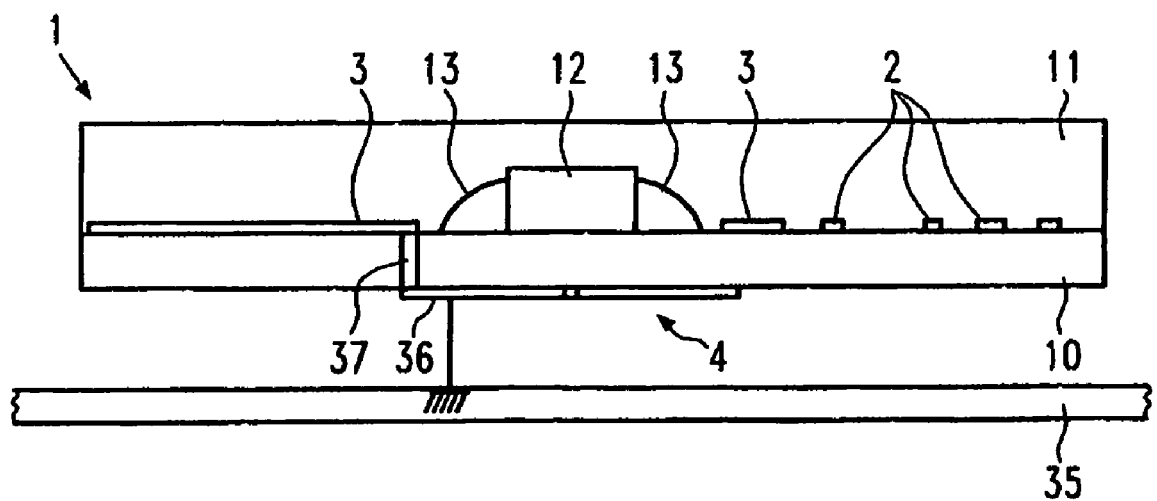
Figure 10:
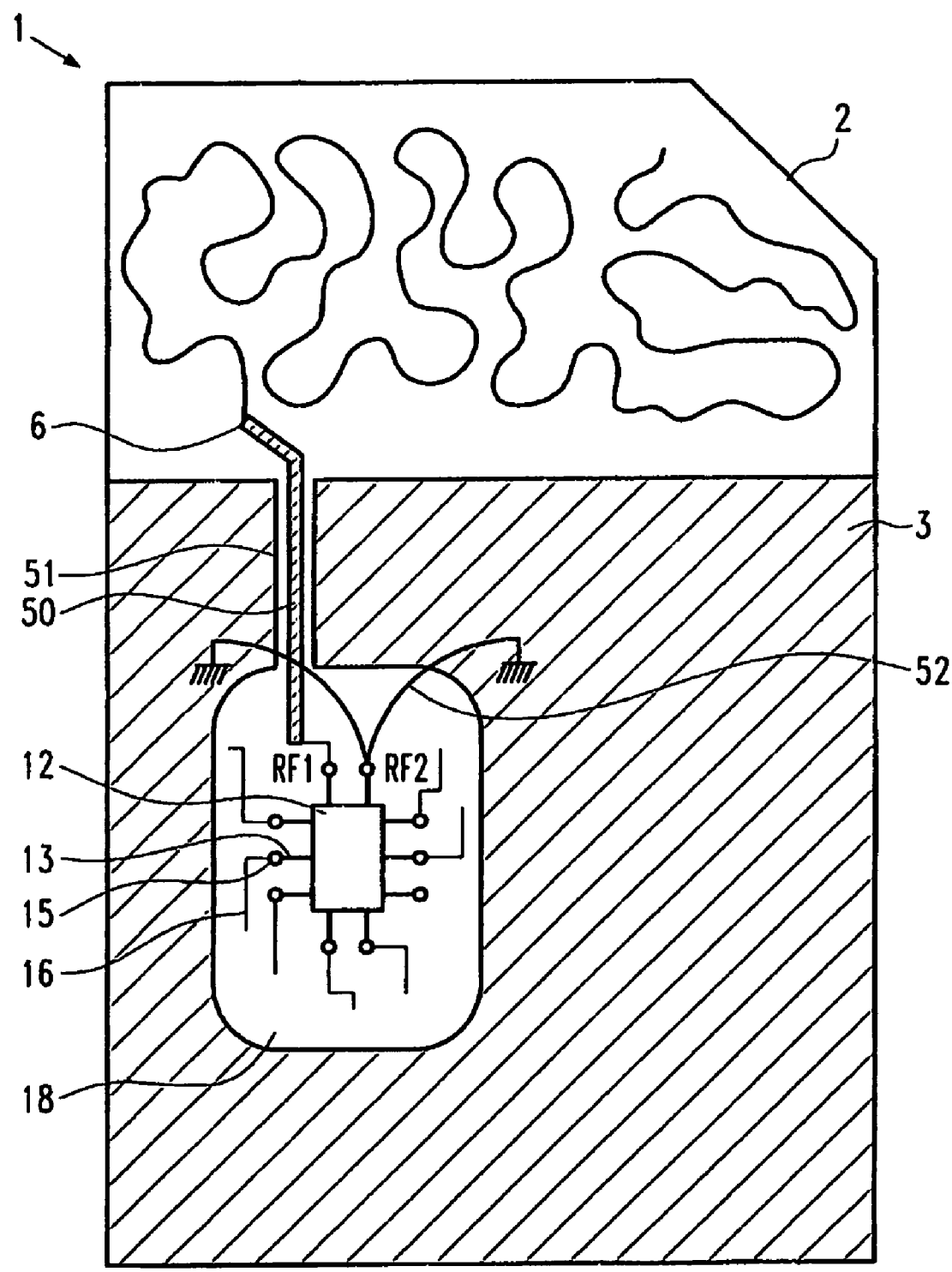
Figure 11:
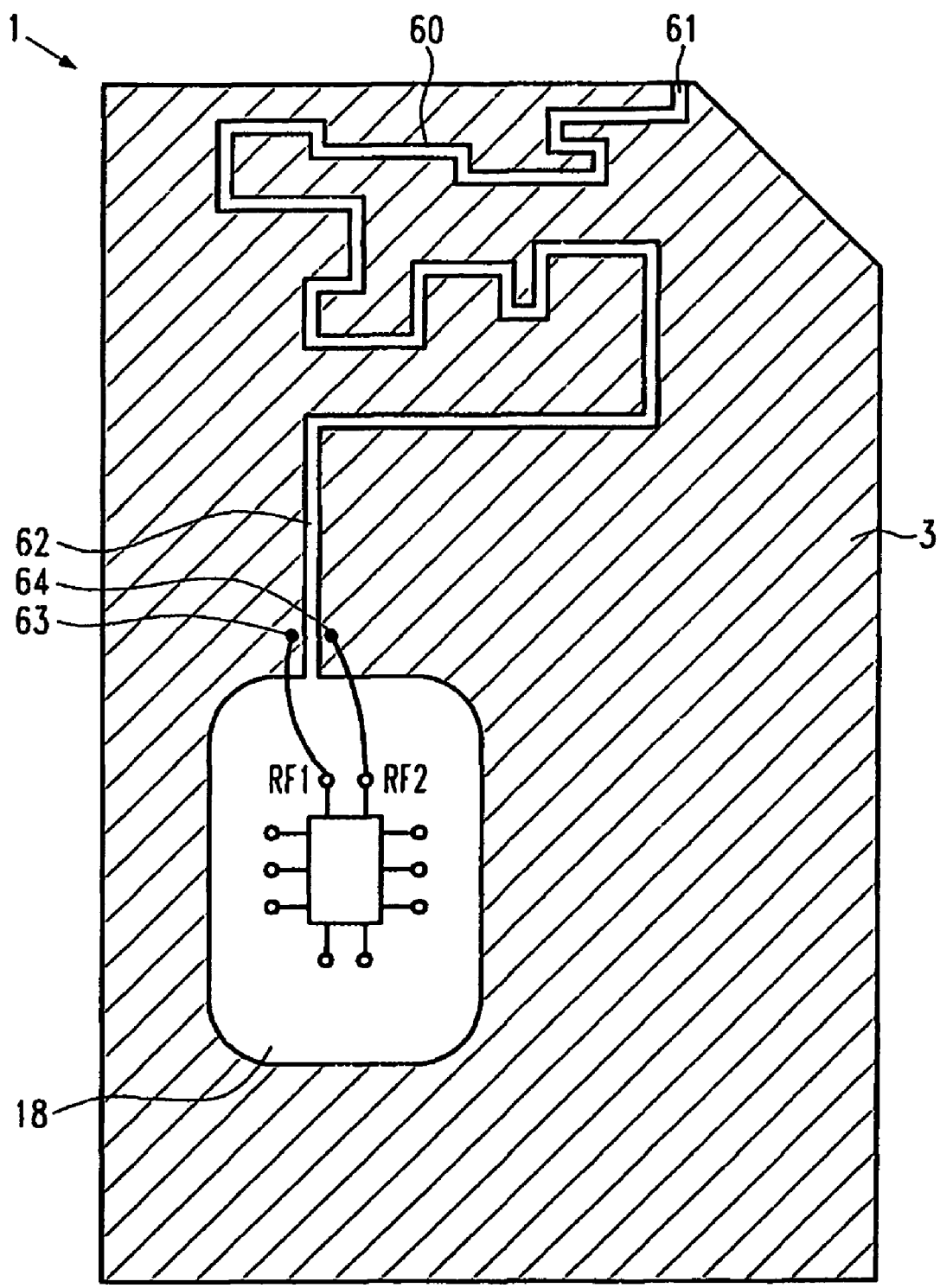
Figure 12:
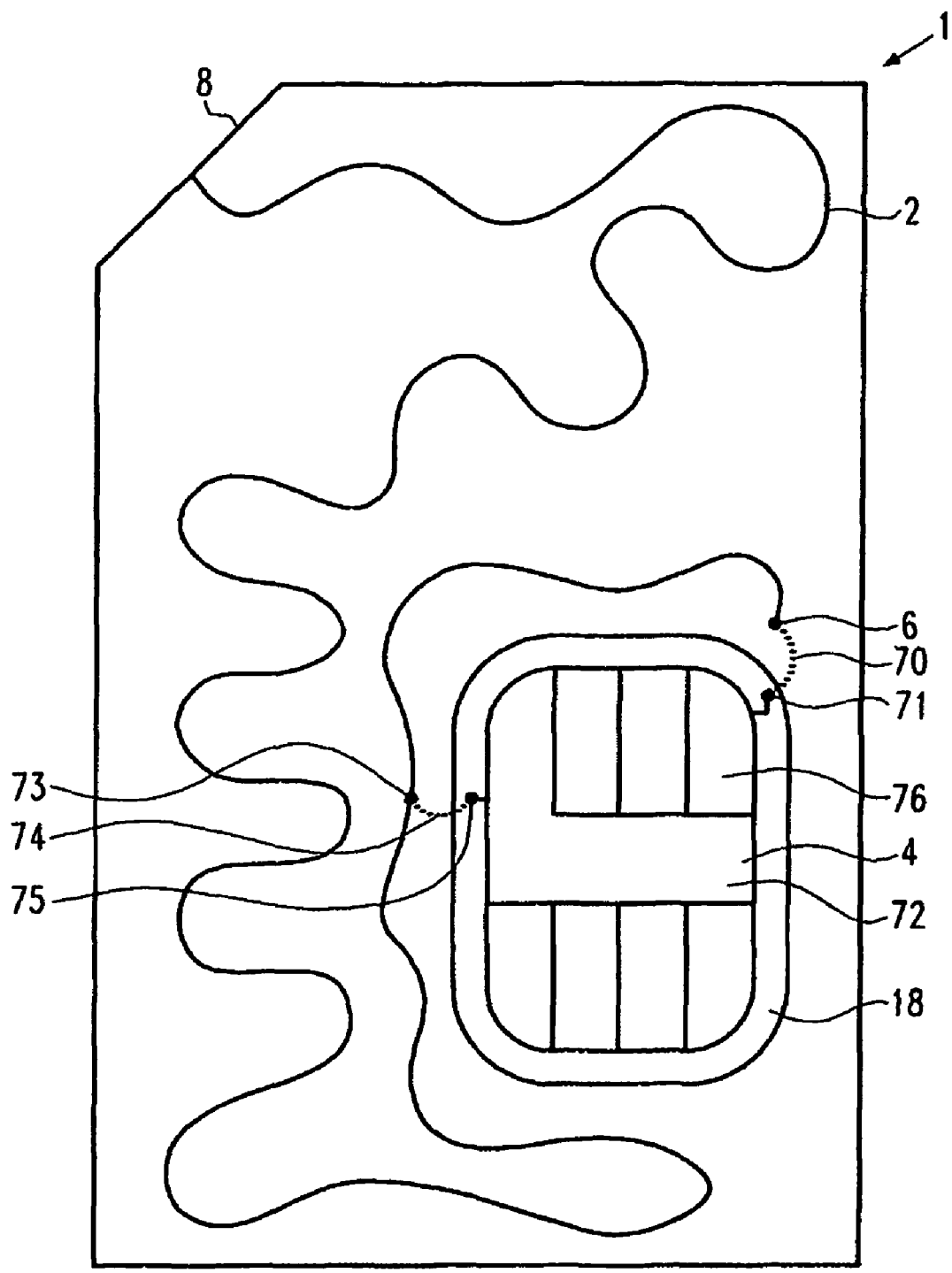
Figure 13:
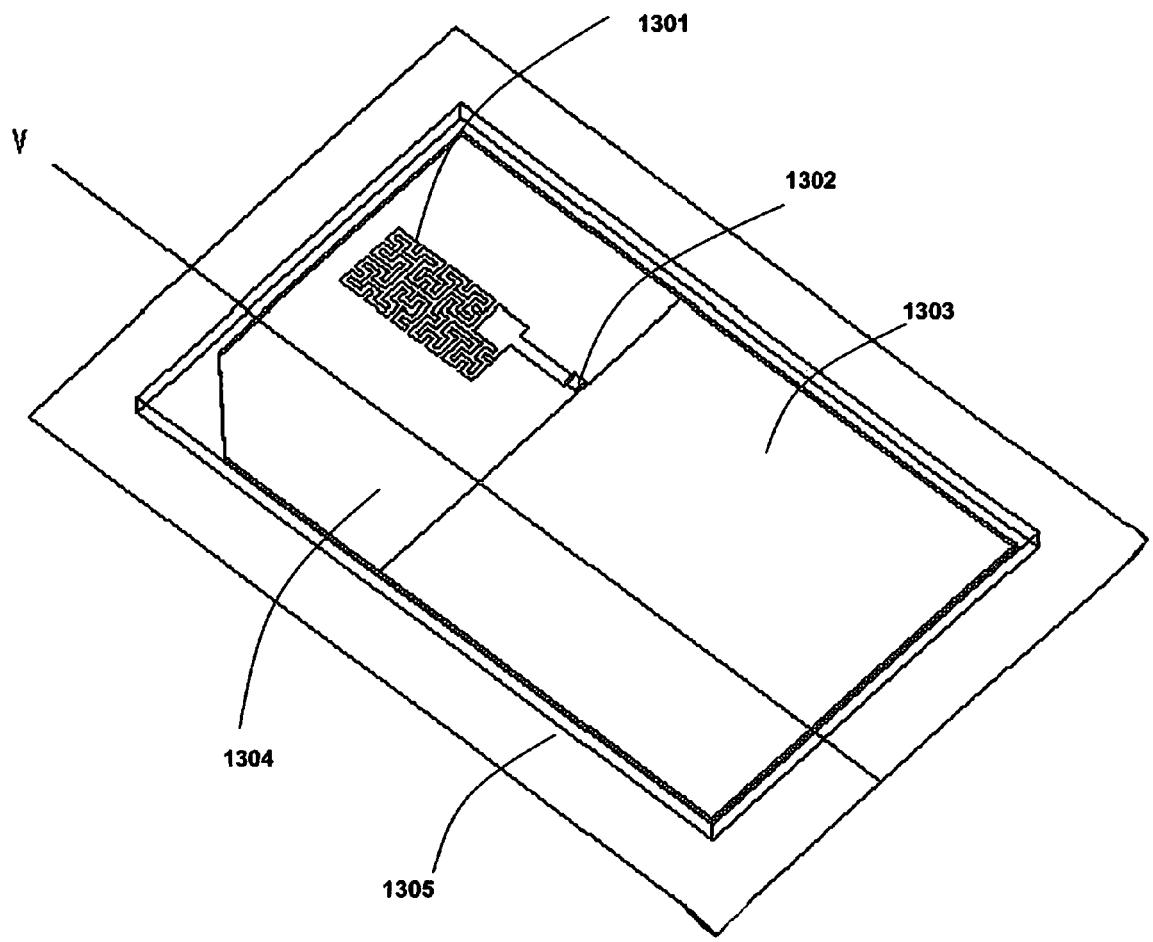
Figure 14:
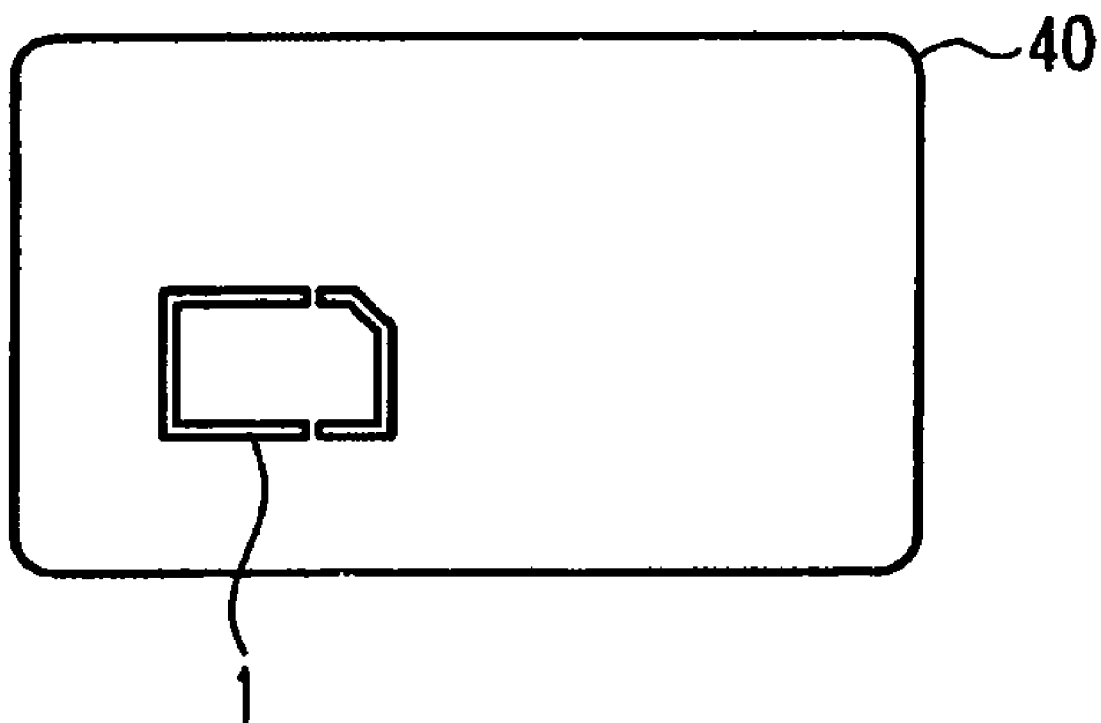
Figure 15:
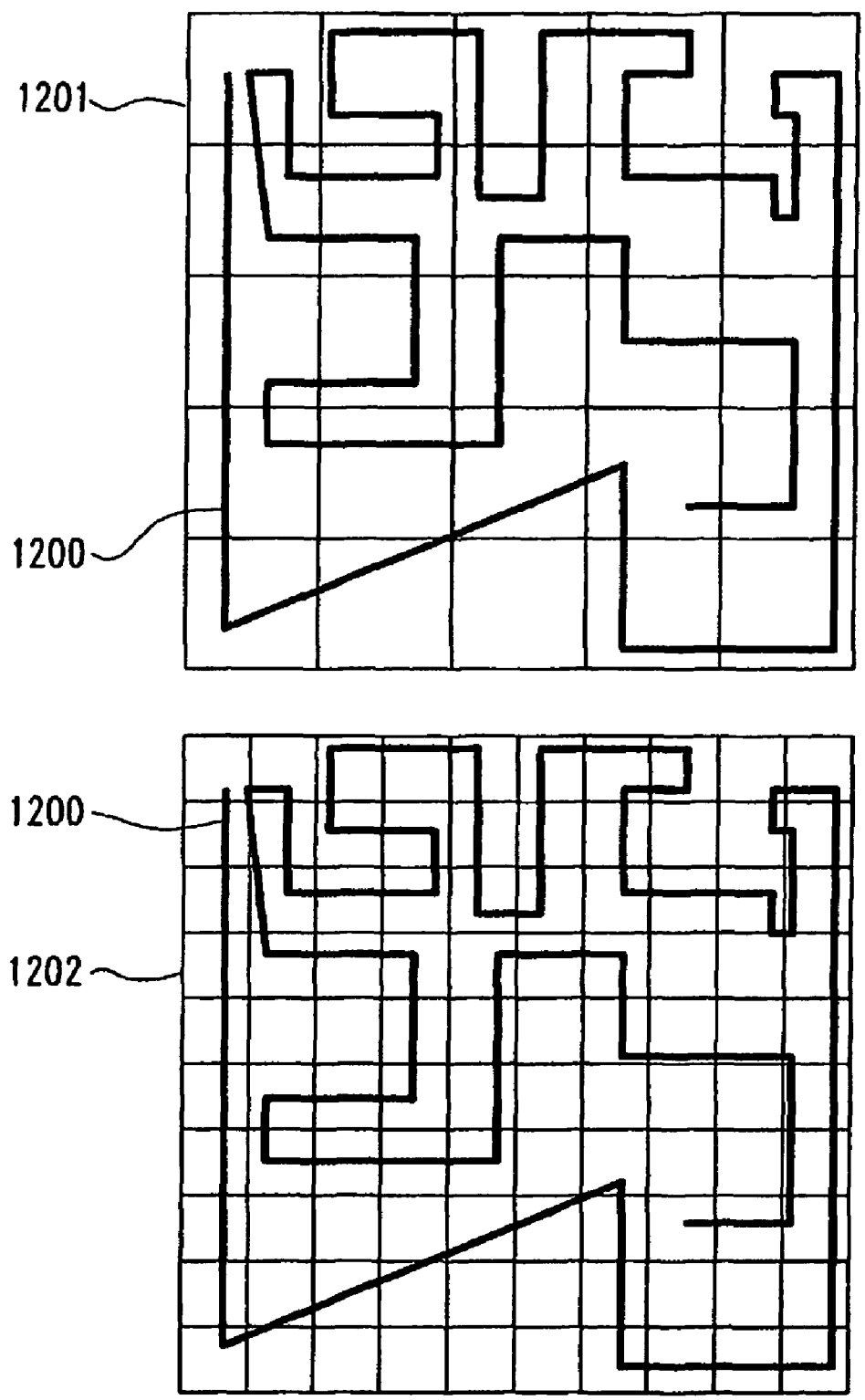
Figure 16:
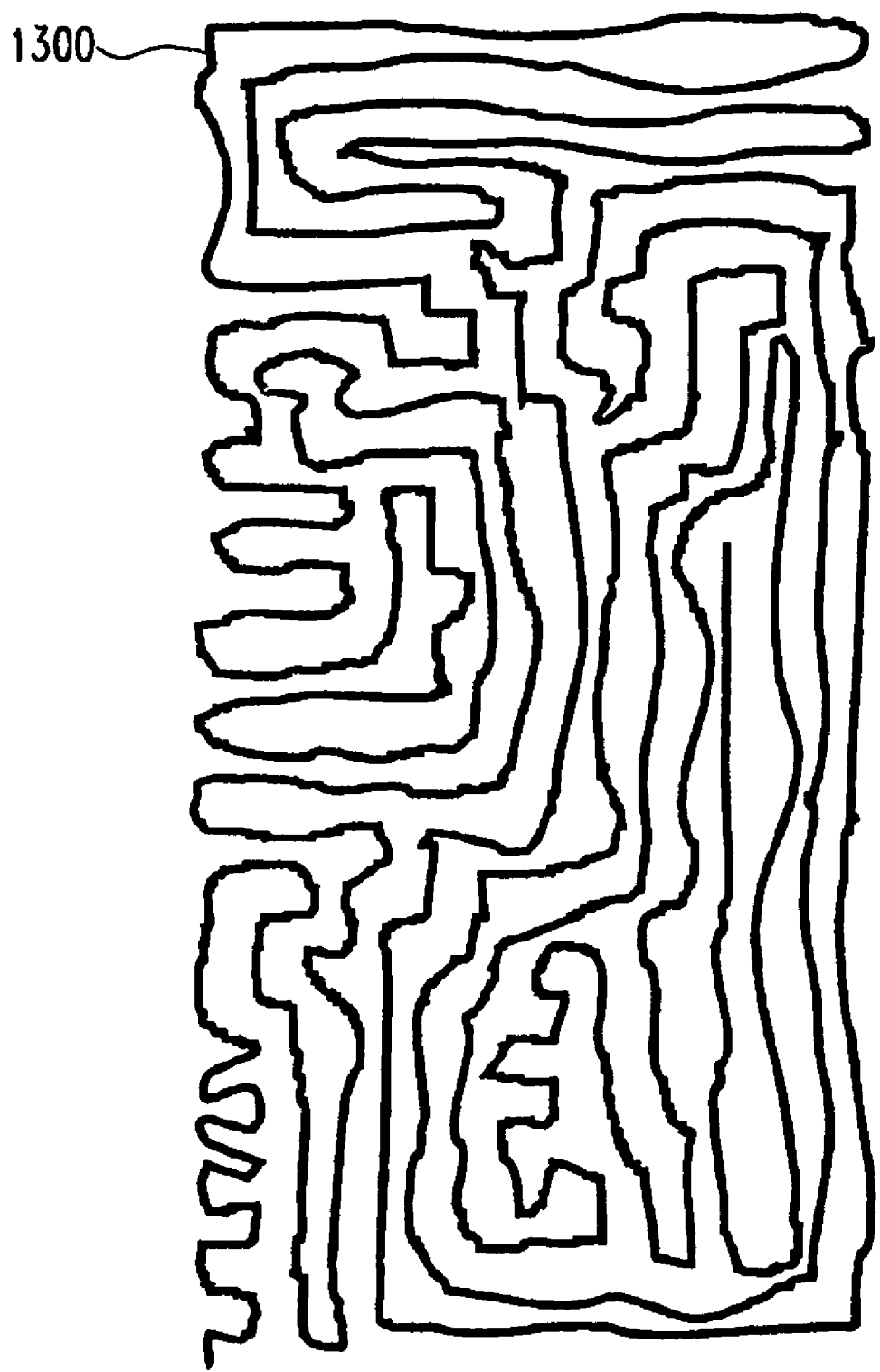
Figure 17:
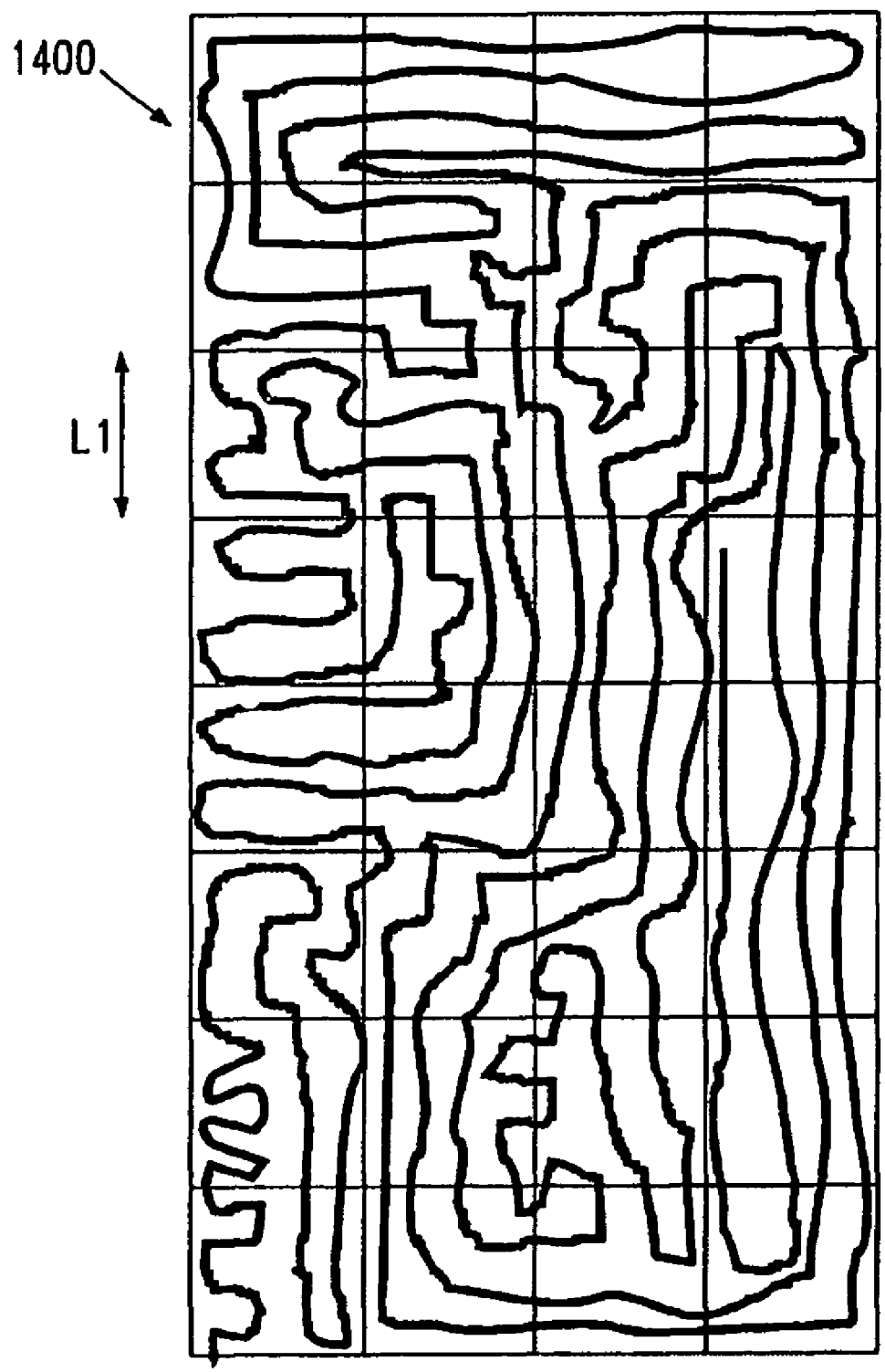
Figure 18:
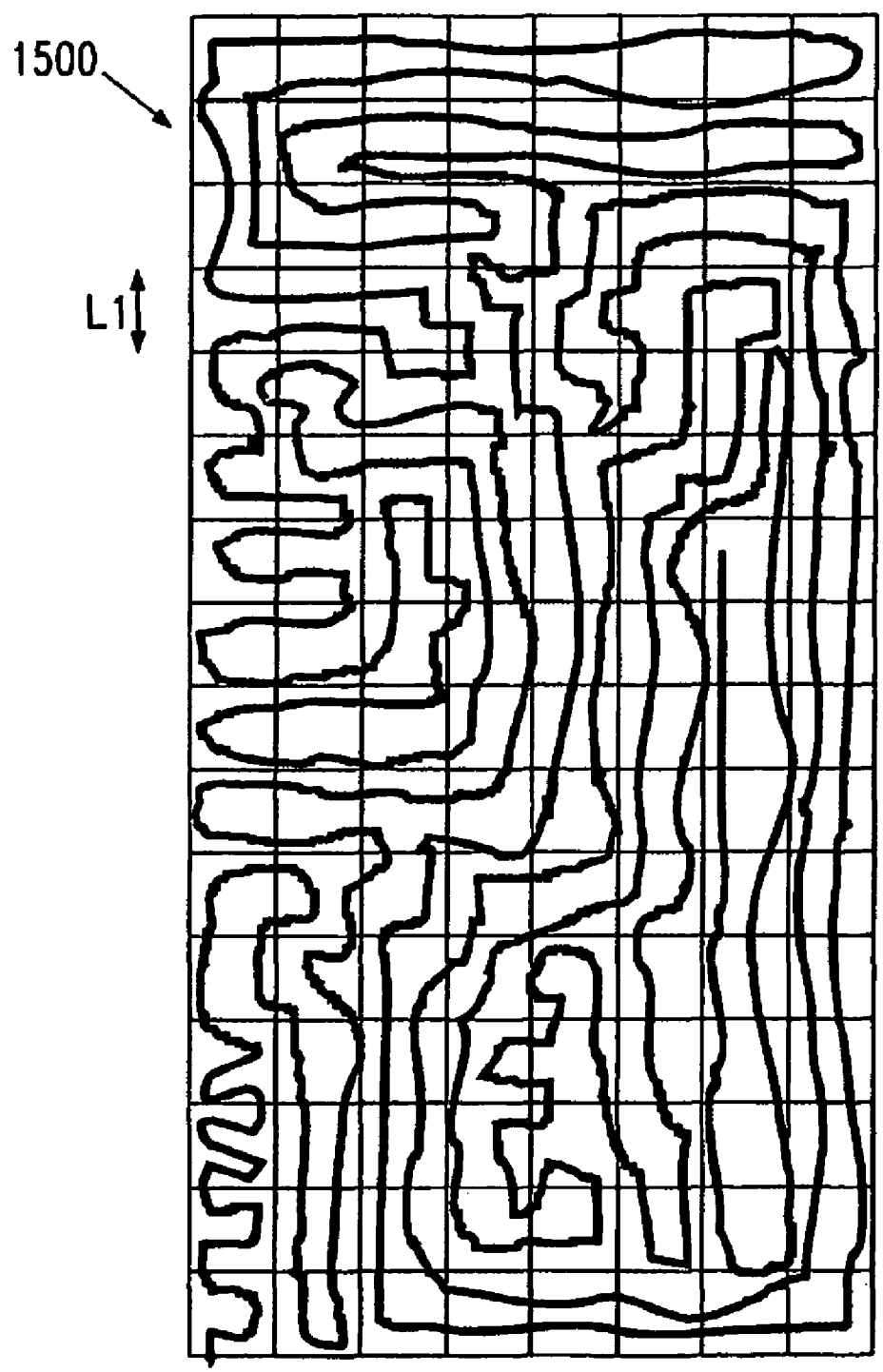
Figure 19:
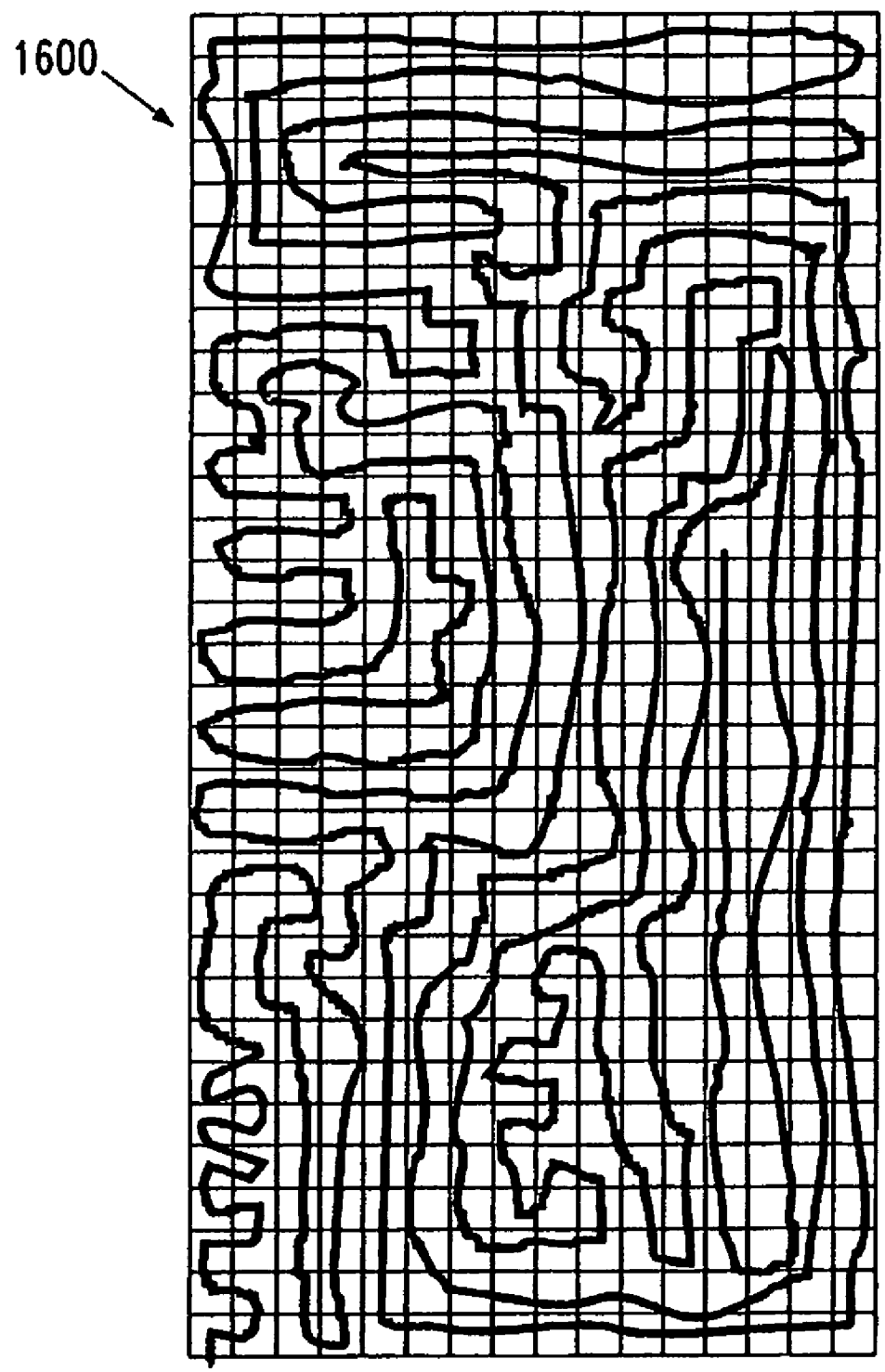

In the following some preferred embodiments of the invention will be described with reference to the enclosed figures. They are provided only for explaining some preferred embodiments of the invention without however limiting the scope of the invention. Here it is shown in:

FIG. 1 a schematic view onto a chip module according to the invention,

FIG. 2 a schematic view on the cut between II-II as shown in FIG. 1,

FIG. 3 a schematic view onto the chip module onto the opposite side in comparison to FIG. 1, FIG. 4 possible shapes of the first and/or second antenna element, FIG. 5 a schematic view of a preferred embodiment of the chip module, FIG. 6 a schematic view of a possible configuration of the second antenna element, FIG. 7 a schematic view of a preferred embodiment of the chip module, FIG. 8 a schematic view of a wireless device, FIG. 9 a schematic view of a section of the wireless device of FIG. 8, FIG. 10 a schematic view onto a chip module according to a preferred embodiment, FIG. 11 a schematic view onto a chip module according to another preferred embodiment, FIG. 12 a schematic view onto a chip module according to a further preferred embodiment, FIG. 13 a schematic view on a particular embodiment of the invention, FIG. 14 a schematic view on a SMART card with a chip module, FIG. 15 example of a box counting curve located in a first grid of 5×5 boxes and in a second grid of 10×10 boxes, FIG. 16 example of a grid dimension curve, FIG. 17 example of a grid dimension curve located in a first grid, FIG. 18 example of a grid dimension curve located in a second grid, FIG. 19 example of a grid dimension curve located in a third grid.

In FIG. 1, a chip module 1 is shown. The chip module operates preferably in the 2.4 GHz ISM band, preferably using a ZigBee connectivity standard. This chip module 1 has a first antenna element 2 that is shaped as a trace. This trace is shown for explanatory purposes only. The shown trace does not necessarily operate at the desired frequency, since this may further depend on the materials involved such as the dielectric constant of the substrate material. This first antenna element 2 has a feeding point 6 and a termination point 7. This first antenna element 2 is provided in a clearance 5 of the second antenna element 3. This means that in the view (perpendicular onto the chip module plane) shown in FIG. 1, the first and the second antenna elements 2, 3 do not overlap.

Furthermore, a contact area 4 is shown. This contact area 4 has different contact pads as shown. Those contact pads are provided in a clearance 18 of the second antenna element 3.

The chip module essentially has a rectangular shape with a notch 8 in one corner (upper left in FIG. 1). The clearance 5 is located next to the notch 8.

The clearance 5 of the second antenna element 3 occupies a certain portion of the chip module as can be seen in FIG. 1. This clearance portion is smaller than the area covered by the second antenna element 3.

A line 9a is shown which is parallel to the short edge and dividing the rectangle in two equal areas (above and below line 9a). The line 9a is provided at a distance (d1+d2)/2 from the short edge of the rectangle. The line 9b is parallel to the long edge and divides the rectangle in two equal areas (left and right of line 9b). The two lines 9a and 9b cross in the middle of the rectangle. The major portion of the contact area 4 is provided in the lower right area of the four areas divided by lines 9a and 9b and the termination point 7 is provided, preferably, in the diagonally opposite area of the four areas. In other embodiments it is possible to place the one or more termination points in any of the four areas.

In FIG. 1, a particular case is shown where the clearance 5 has an extension in the length direction of the chip module (vertical direction in FIG. 1, along the long edge of the chip module) of d1 and the second antenna element 3 has an extension of d2. d1 may be e.g. more than 5, 6, 7, 8, 9, 10, 12, 15, 17, 20, 25 mm or may be less than any of those values. Additionally, the measure d2 may be more than 5, 7, 10, 12, 15, 20 mm or may be less than any of those values. d1 may be less than d2, as e.g. shown in FIG. 1.

As can be seen in FIG. 1 if the measure of d1+d2 is assumed to be 25 mm then the distance between the driving point 6 and the second antenna element 3 is approximately 1 mm or less. In the horizontal direction the driving point 6 is provided on the side of the chip module (right the line 9b) where the major portion of the contact pads area 4 is provided. Further it is separated by a few mm from the right edge.

In some chip modules with d1+d2 other than 25 mm, all the dimensions in the preferred embodiments may be scaled proportionally. In some chip modules with frequency operation other than 2.4 GHz, all the dimensions in the preferred embodiments may be scaled proportionally to the frequency.

In the length direction of the rectangular chip module the first antenna element 2 is provided in the opposite half (upper half above line 9a) in comparison to the half (lower half below line 9b) where the major portion of the contact pad areas is provided.

The longest extension of the chip module 1 in FIG. 1 is the diagonal line extending from the lower left corner to the upper right corner.

In FIG. 2, a cut along a section line II-II as shown in FIG. 1 is shown. On the dielectric substrate 10, contact pads in the area 4 are shown. In FIG. 2, the contacts preside over the bottom surface of the substrate 10. They may, however, also be plane with the surface of substrate 10. In this case, the contact pads in area 4 are embedded in the substrate 10.

The substrate 10 may be provided with via holes or other contact/interconnection means 14 with which it is possible to connect the contact pads in area 4 with the chip 12. Also wire bonds 13 may be used to contact the chip 12 with the contacts in area 4.

In FIG. 2, the ground plane 3 can be seen to be on two sides of the chip 12, since the chip 12 is provided in a clearance of the second antenna element 3. The first antenna element 2 is provided in the clearance 5 of the second antenna element 3.

On the right hand side, cuts to the trace 2 are shown. As can be seen the first antenna element 2 and the second antenna element 3 are provided in the same plane and at the same time on the same surface of a dielectric substrate 10. Other substrates may be provided which will preferably be made parallel to the substrate 10 in order to have further planes or surfaces available to accommodate the first and/or second antenna element or at least a portion thereof. Also a multilayer substrate may be used for this purpose.

As can be seen in FIG. 2 the first and second antenna elements 2, 3 are provided on the same surface of the dielectric substrate 10 as the chip 12.

In FIG. 2 only one chip 12 is shown. Two, three or more chips may, however, be provided.

The chip 12, the connections 13, 14 and the first and second antenna element 2, 3 are embedded in a second dielectric layer 11 which gives the module its outer shape, supports the different components in their position and isolates them against each other.

The substrate 10 and the dielectric layer 11 are omitted in the views of FIG. 1, 3, 5, 7, 10, 11 or 12.

In FIG. 3 the chip module of FIG. 1 is shown from the opposite side (see notch 8). Here the chip 12 can be seen. The chip 12 is connected with wire bonds 13 to a contact point 15. Metallizations 16 extend from each contact point 15 to e.g. a via hole or the like. One metallization extends to another contact point which is connected with a wire bond 17 to the driving point 6 of the first antenna element 2. The second antenna element 3 may also be connected to the chip 12 by a wire bond which directly connects from the chip 12 to the second antenna element 3. An additional metallization and/or wire bond may be provided for such a connection. The metallizations are provided in the same plane and on the same surface as the first and/or second antenna elements 2, 3.

The chip 12 and the metallizations 16 can be seen to be provided in the clearance 18 of the second antenna element 3.

In FIG. 3 a further feature is shown which may be provided in any of the other shown embodiments and which in any case is optional (also in FIG. 3). The first antenna element 2 may be provided with an electrical connection (preferably direct electrical connection) to the second antenna element 3. In this way it is, for example, possible to achieve an inverted-F antenna (IFA). Further by such connections particular resonant modes of the antenna may be suppressed or supported. Such a connection may be given by a trace or a wire bond or the like.

In FIG. 4A, a case is shown where the first antenna element 2a has a trace which is composed of straight segments. Here, the straight segments are all perpendicular to each other. However, smaller than 90° angle or larger than 90° angle may be provided between different segments, such as angles between 30° and 90° and/or angles between 90° and 180°.

At a point where two straight segments connect to each other, they do not have an angle of 180° (flat angle) but different from 180°.

In FIG. 4B, a case is shown where the trace is composed of curved segments. The segments can be identified by a different curvature. With the dotted lines, the separation points between the different segments are indicated. In those points, the curvature changes from a right hand curve to a left hand curve or vice versa.

In FIG. 4C, a case is shown where the trace is composed of curved and straight segments. The straight segments are provided between curved segments. It may also be possible that two straight segments are connected with each other without a curved segment in between, in which case the two straight segments will have an angle at their connection point being different from 180° (see left end of the curve 2c, last two segments). In such a connection point no unique tangent or curvature is given. Such points can be used for identifying the end or ends of a particular segment. Also there may be an angle different from 180° between a curved and a straight segment (see connection between second an third segment and between third and fourth segment when starting from the left end of FIG. 4c). The angle at a connection point between a straight and a curved segment may nevertheless be 180° (see FIG. 4c).

In FIG. 4C, curved segments are identified by a different curvature (curved to the left or curved to the right).

When starting from the left end of FIG. 4c at the first connection point the curve turns to the right and at the second to the left and then again to the right.

In FIG. 4 the trace thickness (line thickness) is constant along the trace. In general 1, 2, 3 or more or all segments may have the same thickness. The thickness of the trace may, nevertheless, vary along the trace or along 1, 2, 3 or more or all segments. E.g. 1, 2, 3, or more segments may be tapered. The thickness may further change in a stepwise fashion at 1, 2, 3 or more connection points of two neighboring segments or within 1, 2, 3 or more segments.

The shapes shown in FIGS. 4a to 4c may also be given by the shapes of the second antenna element 3 or at least by a portion of the second antenna element 3.

A curve composed of straight or curved segments (such as those discussed in relation to FIG. 4) may be the centerline of the conductive trace or may be one border line of the conductive trace.

In FIG. 5, a preferred embodiment of a chip module 1 is shown where the first antenna element 2 is separated from the second antenna element 3 by a gap of size g. A feeding point 6 is outside of the gap. As indicated with the alternative feeding point 6', at least the feeding point 6' and the connection from the feeding point 6' to the antenna element 2 may be given in the gap. Once the trace left the area of the gap, it, however, never returns back into the area of the gap.

The gap surrounds the border of the second antenna element 3. The gap has a width which may be more than 1, 2, 3, 4, 5, 6, 7, 8, 9, 10, 12, 15, 20 percent of the largest extension of the chip module 1.

As can be seen in FIG. 1 and FIG. 5, the feeding terminal 6 is preferably close to the contact area 4, or at least close to the chip 12. This simplifies contacting the chip with the feeding point. This connection may be performed, e.g., by a wire bond or a conductor.

In FIG. 6, a preferred embodiment of the second antenna element 3 is shown. This antenna element 3 has a portion 20 which is given by at least four segments here in particular by 9 segments. The segments may be straight or curved, as explained in connection with FIG. 4.

This portion 20 may also be shaped according to a space filling curve, a box counting curve, a grid dimension curve or a multilevel structure. The entire second antenna element 3 may be shaped according to a space filling curve, a box counting curve, a grid dimension curve or a multilevel structure.

FIG. 7 shows another preferred embodiment of the chip module 1. Here the first antenna element 2 is indicated by a thick line. The second antenna element 3 may comprise a parasitic element 22 which is directly electrically connected with the second antenna element 3. This parasitic element 22 may be provided in a plane parallel to that of the first antenna element 2. At the points where the two lines 2 and 22 in FIG. 7 cross, there is no electric connection since at the crossings, the two patterns are isolated against each other. This may be e.g., given by an isolation film or a dielectric substrate or substrate layer between the two conductive patterns of lines 2 and 22.

The entire parasitic element 22 or at least a portion thereof may also be shaped according to a space filling curve, a box counting curve, a grid dimension curve or a multilevel structure.

The parasitic element 22 starts at the right side and somehow follows the first antenna element 2 to the left. The opposite may be the case, namely that the parasitic element 22 is connected to the second antenna element 3 on the left side and then follows the first antenna element 2 to the right side. In general, the connection point of the parasitic element 22 to the second antenna element 3 may be closer to the termination point 7 of the first antenna element than to the drive point 6. The termination of the parasitic element 22 (if provided) is preferably closer to drive point 6 than to the termination point 7.

In FIG. 8, an example of a wireless device 25 is shown. This wireless device 25 may comprise an antenna 27 such as e.g., the antenna of a mobile telephone system. The antenna 27 is shown schematically only. This antenna 27 is not connected to chip module 1. Further a Bluetooth or WIFI antenna 28 may be provided.

The wireless device 25 also comprises a battery 26. This battery 26 has a grounding terminal 29 connected to ground 30 as can be seen in FIG. 8. The battery is used as a power source for the mobile telephone and optionally also for the chip module 1.

The wireless device 25 also comprises a chip module 1. This chip module 1 may be also connected to ground 30 as shown in FIG. 8. The chip module 1 may be held in a module holder (not shown).

The chip module 1 in FIG. 8 is partially overlapping the battery 26 and partially not overlapping the battery 26. It may also entirely overlap the battery 26 or not overlap the battery 26 at all. The first or the later are preferred but not always possible, depending on the size of the chip module 1, of the battery 26 and of the device 25.

Further, the chip module 1 is separated from the edge of the wireless device 25 in one direction by a distance S1, and in another (perpendicular) direction by a distance S2. S2 may be less than 40, 30, 25, 20, 15, 12, 10, 8, 7 or 5 percent of the largest extension of the wireless device 25 or more than one of those values. The same applies to the separation S1. Usually the smallest separation from an edge (here S1) will be considered to be less than 40, 30, 25, 20, 15, 12, 10, 8, 7 or 5 percent of the largest extension of the wireless device 25 and/or more than one of those values. In some embodiments the smaller the smallest separation the better for antenna performance.

The largest extension of the wireless device 25 in FIG. 8 is given by the diagonal from the lower right up to the upper left corner.

In FIG. 8 the first antenna element is in the upper portion of the chip module 1 and the second antenna element is arranged in the lower portion. With the location below the middle of the wireless device the upper portion shows towards the interior of the wireless device while the lower portion shows towards the periphery. The opposite orientation may be preferred for reasons of the antenna performance.

FIG. 9 shows a section of the wireless device 25 of FIG. 8. The chip module 1 is provided in the upper portion of FIG. 9. In the lower portion, a ground plane 35 of the wireless device 25 is shown. As can be seen in FIG. 9, the second conductive element 3 is connected to one of the contact pads 36 e.g. by a via hole or analogous connecting means 37. This contact pad 36 is used for grounding purposes. It may also be used for grounding a portion of the chip 12. As can be schematically seen in FIG. 9, this grounding terminal 36 or grounding pad 36 is connected to ground 35 of the wireless device. This connection is releasable. This means that the chip module 1 is removable from the wireless device 25.

The second antenna element 3 may also not be connected to the ground plane 35 of the wireless device 25.

A power line (not shown) may be provided from the wireless device 25 to the chip module 1.

In FIG. 10 another preferred embodiment is shown in a view such as in FIG. 3. In this view the second antenna element 3 does not completely enclose the chip 12 or the clearance 18 since a gap or slot 51 is provided. This gap or slot 51 gives room for a feed line 50 which connects the chip 12 with the driving point 6 of the first antenna element 2. This feed line 50 may be connected to the chip 12 with a wire bond. The chip is provided with a RF-terminal RF1. Another RF terminal RF2 is provided for connecting the chip 12 to the second antenna element 3, which is designed as a ground plane here. This connection might be done at the right side, at the left side or at both sides of the feed line 50. A co-planar feed line is shown in this particular case, but a microstrip line, a strip-line, a slot line, a coplanar strip line or the like is possible within the scope of the invention.

In FIG. 11 the case is shown where the first antenna element 3 is given by a slot 60. This slot may be composed of at least 4, 5, 6, 8, 10, 12, 15, 20, 15 or more segments (straight or curved, see explanations of FIG. 4).

The slot antenna is given by a slot 60 in the ground plane (second antenna element). From the chip 12 two RF connections 63, 64 are provided to opposite sides of the feed slot 62 for balanced or unbalanced feeding. Other feeding means than a feeding slot 62 may be given to feed the slot 60, such as e.g. a microstrip line, a strip-line, a slot line, a coplanar strip line or the like. Ground plane element 3 may be connected to a ground layer of the wireless device as for in stance in FIG. 9. The slot 60 is open ended at one end 61, where the slot 60 leaves the border of the second antenna element 3. This end 61 can be provided at an edge of the chip module 1, as shown in FIG. 11.

A further slot may be formed in the second antenna element 3. This slot may start at the clearance 18. If the first slot 60, 62 also starts from the clearance 18, then a combined slot is given. This second slot preferably is closed at the end opposite to the end of the clearance 18, which means, that the slot terminates within the second antenna element 3. It may, nevertheless, also be open ended. More than two, or three slots may be provided at the clearance 18.

In FIG. 12 a schematic view onto the chip module 1 is shown in which no second antenna element is provided. The first antenna element 2 can be shaped such that is covers the major portion of the chip module 1. A drive point 6 is provided close to the pad area 4. In the pad area 4 a RF terminal 76 is given which is connected to the drive point 6 by a wire bond 70 and a metallization which ends at point 71.

Further it is shown, that the first antenna element 2 may be connected to a ground pad 72 by a wire bond 74 which connects the contact point 73 of the first antenna element 2 with the contact point 75 of a metallization which is connected to the ground pad 72. This connection of the first antenna element 2 with the ground pad 75 is optional.

The wire bonds are shown in dotted line since they will be provided on the other side of the chip module than that shown in FIG. 12.

FIG. 13 shows a preferred embodiment of the invention. A SIM card 1305 comprises a first antenna element 1301 including a feeding point 1302, and second antenna element 1303. Both antenna elements 1301 and 1303 are lying on the same layer of a dielectric substrate 1304. Second antenna element 1303 may further include a clearance (not shown) to host contact pads of the SIM card. Also, second antenna element 1303 may further include a connection to a ground pad of the SIM card, therefore becoming a ground element for the antenna system. In the later case, second antenna element becomes connected to the ground of the wireless device and element 1301 extends out of the ground in a monopole arrangement. A particular design of SFC curve is shown in element 1301, which fits in a substantially rectangular area that extends orthogonally from the ground element 1303. Other SFC or grid-dimension curves with other number of segments as described in the present invention are possible as well. Other form factors rather than a rectangular area (such as for instance an 'L', 'C', 'S', 'N' or 'U' area shape, to name a few examples) could be used to enclose the SFC or grid-dimension curves in element 1301.

FIG. 14 shows a SMART card 40 which accommodates a chip module or SIM card 1.

Space Filling Curves

In some examples, at least the first and/or the second antenna element may be miniaturized by shaping at least a portion of the conducting trace, conducting wire or contour of a conducting sheet of the antenna element (e.g., a portion of the arm(s) of a monopole/dipole, of the perimeter of the patch of a patch antenna, of the slot in a slot antenna, of the loop perimeter in a loop antenna, or other portions of the antenna) as a space-filling curve (SFC).

A SFC is a curve that is large in terms of physical length but small in terms of the area in which the curve can be included. More precisely, for the purposes of this patent document, a SFC is defined as follows: a curve having at least five segments (straight or curved, see explanations concerning FIG. 4)), that are connected in such a way that no pair of adjacent segments define a larger straight segment. In addition, a SFC does not intersect with itself at any point except possibly the initial and final point (that is, the whole curve can be arranged as a closed curve or loop, but none of the lesser parts of the curve form a closed curve or loop).

A space-filling curve can be fitted over a flat or curved surface, and due to the angles between straight and straight, straight and curved segments or curved and curved segments or due to the curved segments, the physical length of the curve is larger than that of any straight line that can be fitted in the same area (surface) as the space-filling curve. Additionally, to shape the structure of a miniature antenna, the segments of the SFCs should be shorter than at least one fifth of the free-space operating wavelength, and possibly shorter than one tenth of the free-space operating wavelength. The space-filling curve should include at least five segments in order to provide some antenna size reduction, however a larger number of segments may be used, such as at least 8, 10, 15, 20, 25 or 30 or more segments. In general, the larger the number of segments, and the narrower the angles between them or the stronger the curvature, the smaller the size of the final antenna.

Box-Counting Curves

In other examples, at least the first and/or the second antenna element may be miniaturized by shaping at least a portion of the conducting trace, conducting wire, a slot or contour of a conducting sheet of the antenna to have a selected box-counting dimension. Also a portion of a slot in a ground plane may be shaped as a box-counting curve.

For a given geometry lying on a surface, the box-counting dimension is computed as follows. First, a grid with substantially squared identical cells boxes of size L1 is placed over the geometry, such that the grid completely covers the geometry, that is, no part of the curve is out of the grid. The number of boxes N1 that include at least a point of the geometry are then counted. Second, a grid with boxes of size L2 (L2 being smaller than L1) is also placed over the geometry, such that the grid completely covers the geometry, and the number of boxes N2 that include at least a point of the geometry are counted. The box-counting dimension D is then computed as:

$$D = -\frac{\log(N2) - \log(N1)}{\log(L2) - \log(L1)}$$

For the purposes of the first and/or the second antenna element described herein, the box-counting dimension may be computed by placing the first and second grids inside a minimum rectangular area enclosing the conducting trace, conducting wire or contour of a conducting sheet of the antenna and applying the above algorithm.

The first grid should be chosen such that the rectangular area is meshed in an array of at least 5×5 boxes or cells, and the second grid should be chosen such that L2=½ L and such that the second grid includes at least 10×10 boxes. The minimum rectangular area is an area in which there is not an entire row or column on the perimeter of the grid that does not contain any piece of the curve.

The desired box-counting dimension for the curve may be selected to achieve a desired amount of miniaturization. The box-counting dimension should be larger than 1.1 in order to achieve some antenna size reduction. Preferably it will be larger than 1.2, 1.25, 1.3 or 1.35. If a larger degree of miniaturization is desired, then a larger box-counting dimension may be selected, such as a box-counting dimension ranging from 1.5 to 2. For the purposes of this patent document, curves in which at least a portion of the geometry of the curve has a box-counting dimension larger than 1.1 are referred to as box-counting curves.

For very small antennas, for example antennas that fit within a rectangle having maximum size equal to one-twentieth the longest free-space operating wavelength of the antenna, the box-counting dimension may be computed using a finer grid. In such a case, the first grid may include a mesh of 10×10 equal cells, and the second grid may include a mesh of 20×20 equal cells. The box-counting dimension (D) may then be calculated using the above equation.

In general, for a given resonant frequency of the antenna, the larger the box-counting dimension, the higher the degree of miniaturization that will be achieved by the antenna. One way to enhance the miniaturization capabilities of the antenna is to arrange the several segments of the curve of the antenna pattern in such a way that the curve intersects at least one point of at least 14 boxes of the first grid with 5×5 boxes or cells enclosing the curve. If a higher degree of miniaturization is desired, then the curve may be arranged to cross at least one of the boxes twice within the 5×5 grid, that is, the curve may include two non-adjacent portions inside at least one of the cells or boxes of the grid.

FIG. 15 illustrates an example of how the box-counting dimension of a curve 1200 is calculated. The example curve 1200 is placed under a 5×5 grid 1201 and under a 10×10 grid 1202. As illustrated, the curve 1200 touches N1=25 boxes in the 5×5 grid 1201 and touches N2=78 boxes in the 10×10 grid 1202. In this case, the size of the boxes in the 5×5 grid 1201 is twice the size of the boxes in the 10×10 grid 1202. By applying the above equation, the box-counting dimension of the example curve 1200 may be calculated as D=1.6415. In addition, further miniaturization is achieved in this example because the curve 1200 crosses more than 14 of the 25 boxes in grid 1201, and also crosses at least one box twice, that is, at least one box contains two non-adjacent segments of the curve. More specifically, the curve 1200 in the illustrated example crosses twice in 13 boxes out of the 25 boxes.

Grid Dimension Curves

In further examples, at least the first and/or the second antenna element may be miniaturized by shaping at least a portion of the conducting trace, conducting wire, a slot or contour of a conducting sheet of the antenna to include a grid dimension curve.

Also a portion of a slot in a ground plane may be shaped as a box-counting curve.

For a given geometry lying on a planar or curved surface, the grid dimension of curve may be calculated as follows. First, a grid with substantially identical cells of size L1 is placed over the geometry of the curve, such that the grid completely covers the geometry, and the number of cells N1 that include at least a point of the geometry are counted. Second, a grid with cells of size L2 (L2 being smaller than L1) is also placed over the geometry, such that the grid completely covers the geometry, and the number of cells N2 that include at least a point of the geometry are counted again. The grid dimension D is then computed as:

$$D = -\frac{\log(N2) - \log(N1)}{\log(L2) - \log(L1)}$$

For the purposes of the first and/or the second antenna element described herein, the grid dimension may be calculated by placing the first and second grids inside the minimum rectangular area enclosing the curve of the antenna and applying the above algorithm.

The minimum rectangular area is an area in which there is not an entire row or column on the perimeter of the grid that does not contain any piece of the curve.

The first grid may, for example, be chosen such that the rectangular area is meshed in an array of at least 25 substantially equal cells. The second grid may, for example, be chosen such that each cell of the first grid is divided in 4 equal cells, such that the size of the new cells is L2=½ L1, and the second grid includes at least 100 cells.

The desired grid dimension for the curve may be selected to achieve a desired amount of miniaturization. The grid dimension should be larger than 1.15 in order to achieve some antenna size reduction. If a larger degree of miniaturization is desired, then a larger grid dimension may be selected, such as a grid dimension ranging from 1.5-2. In some examples, a curve having a grid dimension of about 2 may be desired. For the purposes of this patent document, a curve having a grid dimension larger than 1.15 is referred to as a grid dimension curve.

In general, for a given resonant frequency of the antenna, the larger the grid dimension the higher the degree of miniaturization that will be achieved by the antenna. One example way of enhancing the miniaturization capabilities of the antenna is to arrange the several segments of the curve of the antenna pattern in such a way that the curve intersects at least one point of at least 50% of the cells of the first grid with at least 25 cells enclosing the curve. In another example, a high degree of miniaturization may be achieved by arranging the antenna such that the curve crosses at least one of the cells twice within the 25-cell grid, that is, the curve includes two non-adjacent portions inside at least one of the cells or cells of the grid.

An example of a grid dimension curve 1300 is shown in FIG. 16. The grid dimension curve of FIG. 16 placed in a first grid 1400 is shown in FIG. 17. The same curve in a second grid 1500 is shown in FIG. 18 and in a third grid 1600 in FIG. 19.

Multilevel Structures

In some examples, at least a portion or the entire first and/or second antenna element may be coupled, either through direct contact or electromagnetic coupling, to a conducting surface, such as a conducting polygonal or multilevel structure. Further at least a portion or the entire first and/or second antenna element may be given the geometry of a polygonal or multilevel structure.

Also the slot or a portion of a slot may be shaped as a polygonal or multilevel structure.

A multilevel structure is formed by gathering several geometric elements such as for instance polygons or polyhedrons of the same type (e.g., triangles, parallelepipeds, pentagons, hexagons, circles or ellipses as special limiting cases of a polygon with a large number of sides, as well as tetrahedral, hexahedra, prisms, dodecahedra, etc.) and coupling these structures to each other electromagnetically, whether by proximity or by direct contact between elements such that the majority of said geometric elements are generally identifiable as either overlapping or non overlapping elements within said structure. The majority of the component elements of a multilevel have more than 50% of their perimeter (for polygons) not in contact with any of the other elements of the structure. Thus, the component elements of a multilevel structure may typically be identified and distinguished, presenting at least two levels of detail: that of the overall structure and that of the polygon or polyhedron elements that form it.

Additionally, several multilevel structures may be grouped and coupled electromagnetically to each other to form higher-level structures. In a single multilevel structure, all of the component elements are polygons with the same number of sides or are polyhedrons with the same number of faces. However, this characteristic may not be true if several multilevel structures of different natures are grouped and electromagnetically coupled to form meta-structures of a higher level.

A multilevel antenna includes at least two levels of detail in the body of the antenna: that of the overall structure and that of the majority of the elements (polygons or polyhedrons) which make it up. This may be achieved by ensuring that the area of contact or intersection (if it exists) between the majority of the elements forming the antenna is only a fraction of the perimeter or surrounding area of said polygons or polyhedrons.

One example property of multilevel antennae is that the radioelectric behavior of the antenna can be similar in more than one frequency band. Antenna input parameters (e.g., impedance and radiation pattern) remain similar for several frequency bands (i.e., the antenna has the same level of adaptation or standing wave relationship in each different band), and often the antenna presents almost identical radiation diagrams at different frequencies. The number of frequency bands is proportional to the number of scales or sizes of the polygonal elements or similar sets in which they are grouped contained in the geometry of the main radiating element.

In addition to their multiband behavior, multilevel structure antennae may have a smaller than usual size as compared to other antennae of a simpler structure (such as those consisting of a single polygon or polyhedron). Additionally, the edge-rich and discontinuity-rich structure of a multilevel antenna may enhance the radiation process, relatively increasing the radiation resistance of the antenna and reducing the quality factor Q (i.e., increasing its bandwidth).

A multilevel antenna structure may be used in many antenna configurations, such as dipoles, monopoles, patch or microstrip antennae, coplanar antennae, reflector antennae, wound antennae, antenna arrays, or other antenna configurations. In addition, multilevel antenna structures may be formed using many manufacturing techniques, such as printing on a dielectric substrate by photolithography (printed circuit technique); dieing or stamping on metal plate, repulsion on dielectric, or others.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

The invention claimed is:

1. A chip module comprising:
a chip having at least one of memory and microprocessor functionalities;
a radiofrequency circuit;
at least one antenna element having a driving point and being connected to an RF-terminal of the radiofrequency circuit;
contact means operable to connect the chip directly through direct electric contact, the contact means comprising contact pads accessible from an outside of the chip module;
at least one dielectric substrate on which the chip, the radiofrequency circuit, the at least one antenna element, and the contact means are arranged;
wherein the driving point is separated from an edge of the chip module by at least 1 mm but not more than 11 mm;
wherein the chip module is essentially rectangular;
wherein the at least one antenna element is completely arranged in a half of the chip module where a major portion of the contact pads does not exist when considering the essentially rectangular shape divided in two equal portions by a line extending parallel to a short edge of a rectangle.

2. The chip module of claim 1, wherein the at least one antenna element is located in an area where there are no contact means or contact pads.

3. The chip module of claim 1, wherein in a view perpendicular to a plane of the chip module, the contact means or contact pads do not overlap with the at least one antenna element.

4. The chip module of claim 1, wherein the at least one antenna element comprises a conductive pattern which is provided in two or more planes of the at least one dielectric substrate, while a plurality of the two or more planes are preferably parallel to each other.

5. The chip module of claim 1, wherein the driving point is located not further away from the RF-terminal of the radiofrequency circuit than 50 percent of a largest extension of the chip module.

6. The chip module of claim 1, wherein the driving point is provided in a half of the chip module where a major portion of the contact pads exist when considering the essentially rectangular shape divided in two equal portions by a line extending parallel to a long edge of a rectangle.

7. The chip module of claim 1, wherein the at least one antenna element includes at least one connection to a radio frequency ground.

8. The chip module of claim 1, wherein the at least one antenna element comprises at least one termination point.

9. The chip module of claim 8, wherein the chip module comprises four areas separated by at least two straight lines crossing in a middle of a rectangle;
wherein a first line of the at least two straight lines being parallel to a short edge and a second line of the at least two straight lines being parallel to a long edge of the rectangle;
wherein at least one of the four areas contains a major portion of a contact pad area; and
wherein the at least one termination point is provided in an area diagonally opposite to the contact pad area.

10. The chip module of claim 1, wherein the at least one antenna element comprises a conductive pattern, and wherein at least a portion of the conductive pattern is provided on a plane of the at least one dielectric substrate that is in common with a plane of the contact means or contact pads.

11. The chip module of claim 1, wherein the at least one antenna element comprises a first antenna element and a second antenna element, wherein the second antenna element is provided on a same surface of the at least one dielectric substrate as the chip.

12. The chip module of claim 1, wherein the chip module comprises a subscriber identity module (SIM) card.

13. The chip module of claim 1, wherein the chip module comprises at least one of a microprocessor and a radio frequency chip, the chip module being capable of generating and/or receiving radio frequency signals which can be fed to the at least one antenna element.

14. The chip module of claim 1, further comprising:
a second antenna element;
wherein the second antenna element is operable to perform a functionality selected from the list consisting of a ground plane, a ground counterpoise, an arm of a dipole antenna, and combination thereof; and
wherein the second antenna element is connected to at least one of the RF-terminal of the radiofrequency circuit, a ground terminal of the chip, and a contact pad of the chip module that is used for grounding purposes.

15. The chip module of claim 14, wherein except for a feeding point, a first antenna element of the at least one antenna element is separated from the second antenna element by a minimum between 1 mm and 3 mm.

16. The chip module of claim 14, wherein the second antenna element covers a percentage of a largest area of the chip module between approximately 10 percent and approximately 95 percent.

17. The chip module of claim 14, wherein a first antenna element of the at least one antenna element and the second antenna element are provided on a same plane or on a same surface of the at least one dielectric substrate.

18. The chip module of claim 14, wherein a first antenna element of the at least one antenna element comprises a termination point which is closer to a chip module border than to the second antenna element, wherein the termination point is close to or at the chip module border which does not limit the first antenna element of the at least one antenna element.

19. The chip module of claim 14, wherein the second antenna element comprises at least one clearance, the at least one clearance being an area in a plane of the second antenna element where there is no portion of the second antenna element, and wherein the at least one clearance is used for locating at least one of the at least one antenna element, the contact means, the contact pads, and a chip that extends into the plane of the second antenna element.

20. The chip module of claim 19, wherein the at least one clearance accommodates the at least one antenna element and is provided next to a notch of the chip module.

21. The chip module of claim 19, wherein the at least one clearance accommodates the contact pads and is made such that it surrounds and encloses the contact pads in a view perpendicular onto the chip module.

22. The chip module of claim 1, wherein the at least one antenna element comprises at least four segments, wherein the at least four segments comprise straight segments, curved segments, or a combination thereof.

23. The chip module of claim 22, wherein right and left curved segments are provided and/or angles to the left and to the right are provided at connection points of the straight segment.

24. The chip module of claim 1, wherein the at least one antenna element is shaped according to at least one of a space filling curve, a box counting curve, a grid dimension curve, and a multilevel structure.

25. The chip module of claim 1, wherein the chip module comprises a notch in one corner in order to identify an orientation of the chip module and a location of optional contact pads.

26. The chip module of claim 1, wherein the at least one antenna element comprises at least one of a slot, a monopole, a dipole, and a part of a dipole.

27. The chip module of claim 1, further comprising:
a network arranged between the radiofrequency circuit and the at least one antenna element; and
wherein the network is selected from the group consisting of a passive network, an active network, a matching network, a filter, a balun network, and combinations thereof.

28. The chip module of claim 1, wherein the chip module is operable for operation in a far field such that data is transmitted via a wireless connection between devices which are separated by more than a half-wavelength; and
wherein said wireless operation occurs in a range of about 3 to 5 meters.

29. The chip module of claim 1, wherein operation frequencies are above 800 MHz.

30. The chip module of claim 1, wherein the radiofrequency circuit is arranged in the chip.

31. The chip module of claim 1, further comprising a second chip, the second chip including the radiofrequency circuit.

32. A wireless device comprising:
a first ground plane;
a battery; and
a chip module, the chip module comprising:
  a chip having at least one of memory and microprocessor functionalities;
  a radiofrequency circuit; and
  at least one antenna element having a driving point and being connected to an RF-terminal of the radiofrequency circuit;
  a second ground plane, the second ground plane acting in cooperation with the at least one antenna element;
  contact means operable to connect the chip directly through a direct electric contact, the contact means comprising contact pads accessible from an outside of the chip module; and
  at least one dielectric substrate on which the chip, the radiofrequency circuit, the at least one antenna element, the second ground plane, and the contact means are arranged.

33. The wireless device of claim 32, wherein a first antenna element of the at least one antenna element is separated from the ground plane and the battery by more than about 0.5 mm but less than about 5 mm.

34. The wireless device of claim 32, wherein the second ground plane is connected to the first ground plane.

35. The wireless device of claim 32, further comprising:
a member;
wherein the member is selected from the list consisting of a display, a digital connector, a power supply connector, a Bluetooth/WIFI antenna, an antenna of a mobile telephone system, and combinations thereof; and
wherein the chip module is separated from a ground contact of said member by at least 20 percent of a largest extension of the wireless device.

36. The wireless device of claim 32, wherein the wireless device comprises a chip module holder made of plastic or dielectric materials.

37. The wireless device of claim 32, wherein the chip module further comprises:
a second antenna element; and
wherein the chip module is arranged in such an orientation that a first antenna element of the at least one antenna element shows to a periphery while the second antenna element shows towards an interior of the wireless device when the chip module is substantially parallel to the ground plane of the wireless device.

38. The wireless device of claim 32, wherein the chip module is removable from the wireless device.

39. A method for wireless communication comprising:
establishing a wireless connection between a chip module of a wireless device and a device outside of the wireless device, the device being separated from the wireless device by more than a free space operating wavelength of the wireless device;
reading out information from the at least one chip;
wherein the chip module comprises:
  a chip having at least one of memory and microprocessor functionalities;
  a radiofrequency circuit;
  at least one antenna element having a driving point and being connected to an RF-terminal of the radiofrequency circuit;
  contact means operable to connect the chip directly through direct electric contact, the contact means comprising contact pads accessible from an outside of the chip module; and at least one dielectric substrate on which the chip, the radiofrequency circuit, the at least one antenna element, and the contact means are arranged;

wherein the driving point is separated from an edge of the chip module by at least 1 mm and not more than 11 mm; and wherein the driving point is located not further away from the RF-terminal than 50 percent of a largest extension of the chip module.

40. The method of claim 39, wherein with the step of reading out information, the device is operable to perform actions only possible with data of the chip module; and wherein the actions include at least one action from the group consisting of a financial transaction, a telephone call, a remote payment transaction with a mobile phone or the wireless device without connecting to a mobile or cellular network, and combinations thereof.

* * * * *